US012565703B2

(12) United States Patent     (10) Patent No.:     US 12,565,703 B2

Eden et al.                      (45) Date of Patent:     Mar. 3, 2026

(54) ATOMIC LAYER DEPOSITION AND VAPOR DEPOSITION REACTOR WITH IN-CHAMBER MICROPLASMA SOURCE

(71) Applicant: The Board of Trustees of the University of Illinois, Urbana, IL (US)

(72) Inventors: J. Gary Eden, Champaign, IL (US); Sung-Jin Park, Urbana, IL (US); Andrey Mironov, Urbana, IL (US); Jinhong Kim, Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 1103 days.

(21) Appl. No.: 17/285,182

(22) PCT Filed: Oct. 15, 2019

(86) PCT No.: PCT/US2019/056349

§ 371 (c)(1),
(2) Date: Apr. 14, 2021

(87) PCT Pub. No.: WO2020/081574

PCT Pub. Date: Apr. 23, 2020

(65)                Prior Publication Data

US 2021/0388498 A1     Dec. 16, 2021

Related U.S. Application Data

(60) Provisional application No. 62/745,611, filed on Oct. 15, 2018.

(51) Int. Cl.
H01L 21/306        (2006.01)
C23C 16/40        (2006.01)
(Continued)

(52) U.S. Cl.
CPC ...... *C23C 16/45544* (2013.01); *C23C 16/403* (2013.01); *C23C 16/45538* (2013.01);
(Continued)

(58) Field of Classification Search
CPC .............. H01J 37/32091; H01J 37/321; H01J 37/32366; H01J 37/32036;
(Continued)

(56)                References Cited

U.S. PATENT DOCUMENTS 5,518,572 A *  5/1996  Kinoshita ......... H01J 37/32633
                                                    118/723 MP
8,004,017 B2    8/2011  Eden et al.
(Continued)

FOREIGN PATENT DOCUMENTS

WO        2020036971 A1      2/2020

OTHER PUBLICATIONS

Suntola, "Atomic Layer Epitaxy", Materials Science Reports, 1989, pp. 261-312, vol. 4, Elsevier Science Publishers B.V., North-Holland.

(Continued)

*Primary Examiner* — Luz L Alejandro Mulero
(74) *Attorney, Agent, or Firm* — Steven P. Fallon; Greer, Burns & Crain, Ltd.

(57)                ABSTRACT

An in-chamber plasma source in a deposition reactor system includes an array of microcavity or microchannel plasma devices having a first electrode and a second electrode isolated from plasma in microcavities or microchannels. An inlet provides connection to deposition precursor. A region interacts deposition precursor with plasma. An outlet directs precursor dissociated with the plasma onto a substrate for deposition. A reactor system includes a substrate holder across from the outlet, a chamber enclosing the in-chamber plasma source and the substrate holder, an exhaust from the (Continued)

chamber, and conduit supplying precursors from sources or bubblers to the inlet. A reactor system can conduct plasma enhanced atomic layer deposition at high pressures and is capable of forming a complete layer in a single cycle.

12 Claims, 21 Drawing Sheets

(51) Int. Cl.

| | |
|---|---|
| *C23C 16/455* | (2006.01) |
| *C23C 16/48* | (2006.01) |
| *C23C 16/509* | (2006.01) |
| *H01J 37/32* | (2006.01) |
| *H01L 21/02* | (2006.01) |
| *H05H 1/24* | (2006.01) |
| *H05H 1/46* | (2006.01) |

(52) U.S. Cl.
CPC ........ *C23C 16/482* (2013.01); *C23C 16/5093* (2013.01); *H01J 37/32082* (2013.01); *H01J 37/32091* (2013.01); *H01J 37/32348* (2013.01); *H01J 37/32366* (2013.01); *H01J 37/32715* (2013.01); *H01L 21/02274* (2013.01); *H05H 1/24* (2013.01); *H05H 1/2406* (2013.01); *H05H 1/245* (2021.05); *H05H 1/4645* (2021.05); *H05H 1/466* (2021.05); *H01J 2237/332* (2013.01); *H01L 21/02175* (2013.01); *H01L 21/02178* (2013.01); *H01L 21/02205* (2013.01); *H01L 21/0228* (2013.01)

(58) Field of Classification Search
CPC ........... H01J 37/32082; H01J 37/32532; H01J 37/32541; H01J 37/32568; H05H 1/466; H05H 1/4645; H05H 1/245; H05H 1/24; H05H 1/2406; C23C 16/45544
See application file for complete search history.

(56) References Cited

U.S. PATENT DOCUMENTS

| | | | | |
|---|---|---|---|---|
| 8,404,558 | B2 | 3/2013 | Eden et al. | |
| 8,456,086 | B2 | 6/2013 | Eden et al. | |
| 8,890,409 | B2 | 11/2014 | Eden et al. | |
| 8,957,572 | B2 | 2/2015 | Eden et al. | |
| 9,390,894 | B2 | 7/2016 | Eden et al. | |
| 9,972,501 | B1 | 5/2018 | Kuyel | |
| 2004/0038525 | A1 | 2/2004 | Meng et al. | |
| 2010/0037824 | A1 | 2/2010 | Lee | |
| 2012/0289054 | A1* | 11/2012 | Holland | H01J 37/32633 438/711 |
| 2015/0008825 | A1* | 1/2015 | Eden | H01J 37/32568 315/111.21 |
| 2015/0270110 | A1* | 9/2015 | Eden | A23L 3/34095 422/186.04 |
| 2016/0064208 | A1 | 3/2016 | Zafiropoulo et al. | |
| 2016/0327310 | A1* | 11/2016 | Dai | C01B 13/0207 |
| 2019/0214244 | A1* | 7/2019 | Eden et al. | |

OTHER PUBLICATIONS

Stark et al., "Direct current glow discharges in atmospheric air", Applied Physics Letters, 1999, pp. 3770-3772, vol. 14, No. 25, American Institute of Physics.

Schoenbach et al., "Microhollow cathode discharges", Journal of Vacuum Science Technology A—Vacuum Surfaces, and Films, 2003, pp. 1260-1265, vol. 21, No. 4, American Vacuum Society.

Moravej et al., "A radio-frequency nonequilibrium atmospheric pressure plasma operating with argon and oxygen", Journal of Applied Physics, 2006, pp. 1-6, vol. 99, No. 093305, American Institute of Physics.

International Search Report and Written Opinion from the corresponding International Patent Application No. PCT/US2019/056349, dated Dec. 2, 2019.

* cited by examiner

ATOMIC LAYER DEPOSITION AND VAPOR DEPOSITION REACTOR WITH IN-CHAMBER MICROPLASMA SOURCE

PRIORITY CLAIM AND REFERENCE TO RELATED APPLICATION

The application claims priority under 35 U.S.C. § 119 and all applicable statutes and treaties from prior U.S. provisional application Ser. No. 62/745,611, which was filed Oct. 15, 2018.

STATEMENT OF GOVERNMENT INTEREST

This invention was made with government support under FA9550-14-1-0002 awarded by the United States Air Force. The government has certain rights in the invention.

BACKGROUND

The deposition of ultrathin films is at the heart of the electronic device industry. Thin films of both electronic materials (Si, Ge, and the III-V materials such as GaAs and AlN) and a wide variety of dielectrics are essential to fabricating the multilayer electronic devices (DRAM, microprocessors, etc.) that are currently being manufactured by Intel, AMD, Micron, Samsung, Taiwan Semiconductor, and others. As a result of the relentless shrinkage of electronic device feature sizes into the nanometer (nm) region, precision control of layer thickness over the 1-100 nm interval and excellent conformability (i.e., the degree to which a film "follows" the shape of the surface under it) are essential.

Atomic layer deposition (ALD) is the preferred process for depositing thin films with atomic precision. That is, ALD actually allows films to be grown one layer of atoms at a time. The importance of ALD to current semiconductor processing was underscored by the International Technology Roadmap for Semiconductors (ITRS) which stressed the pivotal role of ALD in fabricating: 1) high quality gate oxides ($Al_2O_3$, $ZrO_2$, and $HfO_2$) for MOS (metal-oxide semiconductor) structures, 2) trench capacitors for DRAM (dynamic random access memory) chips, 3) and the interface passivation layer for III-V semiconductor devices. First demonstrated in 1974 by Dr. Tuomo Suntola of the University of Helsinki for electroluminescent displays, ALD is a sequential deposition process in which one layer of atoms is deposited at a time because each step in the process "self terminates." [1] Conventional ALD consists of four steps: 1) exposure of the substrate to one precursor (a molecule containing the atom of interest) which leads to the first layer of atoms depositing onto the underlying substrate; 2) purging of the remaining (unreacted) precursor molecules from the vacuum chamber (the processing tool); 3) exposure of the new surface to the "co-reactant" atoms or molecules, thus completing the growth of the first layer of a compound film; and 4) evacuation of the unused co-reactant molecules from the tool. As an example, a film of aluminum nitride (AlN), a photonic material, can be produced by first introducing trimethylaluminum (TMA, $Al(CH_3)_3$) to the chamber. TMA has a high vapor pressure and serves only as a means of transporting aluminum atoms to the substrate. When TMA molecules impinge on a heated substrate, the molecule dissociates, leaving Al atoms on the surface and $CH_4$ (methane) as a product gas that can then be evacuated from the chamber. Subsequently, a source of nitrogen (such as ammonia, $NH_3$) is introduced to the tool and, reacting with the Al atoms, forms AlN and hydrogen.

Two overriding characteristics of conventional ALD must be emphasized. The first is that the process is self-terminating, as mentioned earlier. That is, film growth proceeds only one layer at a time (at most). The sequential alternation of the flow of two or more precursors (such as TMA and ammonia for AlN) constrains (forces) film growth to proceed at a rate of one monolayer per growth cycle. If one wishes to have thicker films, the four-cycle process is simply repeated.

The second and most critical aspect of conventional ALD is that the energy required to dismantle (dissociate) the precursors and "liberate" the desired atom(s) is supplied by temperature. That is, the substrate on which a film is to be grown is heated so as to promote the dissociation of the precursor at the hot surface, thereby leaving behind the desired atom. Heating of the substrate also increases atom mobility that is generally desirable for the formation of crystalline films. The drawback of this approach is that state-of-the art electronic devices are multi-layered, and the growth of a thin film onto a stack of already-deposited films on a heated substrate has the unintended consequence of causing the layers to partially intermix because of atomic diffusion. This "blurring" of the layers is (to put it mildly) detrimental to the performance of semiconductor-based devices, such as quantum wells and superlattices, that are based on multiple layers. This problem becomes ever more pressing as the layer thickness has dropped below 100 nm because diffusion need not progress far before considerable damage is done to the layers in a device.

For these reasons, it was recognized that plasmas could be useful in partially "cracking" precursors. Known as plasma-enhanced atomic layer deposition (PEALD), this process involves the installation of a plasma device or system outside the deposition tool. Partial or complete dissociation of precursors with a plasma is capable of lowering the substrate temperature and reducing the incorporation of undesired atoms into a film. PEALD is a widely-used alternative to thermal (conventional) ALD because the plasma source creates highly reactive radicals that enhance chemical reactions at a surface. Furthermore, PEALD provides more options for film growth because the reactivity of ALD precursors (such as TMA and ammonia) is lower than the radicals and molecular fragments produced directly from the precursors by the plasma. As an example, NH and $NH_2^*$ (where the asterisk denotes an electronic excited state of the radical) are far more reactive than is the ammonia molecule itself.

The primary drawback of conventional plasma sources for PEALD such as inductively- and capacitively-coupled discharges, RF discharges, and Electron Cyclotron Resonance (ECR) sources is that they invariably require low pressures and large power supplies for operation. Furthermore, many also require complex impedance-matching electronics or antennas to launch power into the plasma. All of these considerations raise the complexity, cost, and physical size of the plasma source while limiting the range in parameters over which the ALD system will function. [2-4] Of particular concern are the gas flow pressure and rate, and the power per unit volume that can be deposited into the plasma. Both severely limit the rate of precursor dissociation and, hence, the number of radicals and excited species that arrive at each square cm of the substrate surface.

REFERENCES

1. Suntola, T., *Atomic layer epitaxy*. Materials Science Reports, 1989. 4(5): p. 261-312.

2. Stark, R. H. and K. H. Schoenbach, *Direct current glow discharges in atmospheric air*. Applied Physics Letters, 1999. 74(25): p. 3770-3772.
3. Schoenbach, K. H., et al., *Microhollow cathode discharges*. Journal of Vacuum Science & Technology A, 2003. 21(4): p. 1260-1265.
4. Moravej, M., et al., A radio-frequency nonequilibrium atmospheric pressure plasma operating with argon and oxygen. Journal of Applied Physics, 2006. 99(9): p. 093305

SUMMARY OF THE INVENTION

A preferred embodiment provides an in-chamber plasma source in a deposition reactor system includes an array of microcavity or microchannel plasma devices having a first electrode and a second electrode isolated from plasma in microcavities or microchannels. An inlet provides connection to deposition precursor. A region interacts deposition precursor with plasma. An outlet directs precursor dissociated with the plasma onto a substrate for deposition. A reactor system includes a substrate holder across from the outlet, a chamber enclosing the in-chamber plasma source and the substrate holder, an exhaust from the chamber, and conduit supplying precursors from sources or bubblers to the inlet. A reactor system can conduct plasma enhanced atomic layer deposition at high pressures and is capable of forming a complete layer in a single cycle.

A method for deposition, the method generates a plasma with an array of microplasma devices in a reaction chamber. The plasma is interacted with deposition precursor to dissociate the deposition precursor. Disassociated deposition precursor is deposited on a substrate.

DETAILED DESCRIPTION OF THE PREFERRED EMBODIMENTS

Preferred embodiment ALD methods and PEALD and vapor deposition reactors provide for growth of ultrathin electronic films by a process in which precursors are dissociated by arrays of microcavity plasmas located within the reactor. This provides many benefits compared to conventional ALD and PEALD. As an example, the size and materials composition of the microcavity plasma arrays allow for the plasma source to be located within the film growth chamber, rather than outside. Since the radicals and excited species produced by plasmas have a limited lifetime (because they are chemically or electronically unstable), locating the plasma source(s) in close proximity to the substrate dramatically raises the number of reactive species that reach the substrate. Furthermore, microplasmas function best at pressures of hundreds of Torr, which is typically three orders of magnitude larger than those accessible to commercially-available plasma sources. Both of these considerations ensure that a PEALD process in a reactor of the invention proceeds more quickly and much more efficiently than in a conventional ALD or PEALD reactor. A reactor of the invention can also conduct plasma enhanced chemical vapor deposition but is especially useful for PEALD.

Conventional ALD and PEALD are often not successful in growing one complete monolayer film in one cycle. That is, there are "gaps" in the monolayer that must be repaired with the next growth cycle. The result is that the growth rate for films is much lower than it would be if a complete monolayer was grown with each cycle. Finally, these gaps or defects in the monolayer may lead to defects in the finished film. In a PEALD reactor of the invention, the film growth rates are exactly what one would predict if a single, complete monolayer of aluminum oxide ($Al_2O_3$), for example, was grown every cycle. This also permits the substrate temperature to be reduced further than in the conventional ALD and PEALD processes. Another advantage provided by a PEALD reactor of the invention is that the incorporation of impurities in the film (such as carbon) can be reduced relative to those inherent to conventional ALD techniques.

Experimental PEALD reactors of the invention with microcavity array plasma sources have successfully grown high-quality $Al_2O_3$, $Ga_2O_3$ (beta-phase), and AlN films with thicknesses between 10 and 300 nm. Deposition of these films over a 3" (7.5 cm) diameter silicon wafer appears to be uniform and the growth rate/cycle for $Al_2O_3$ is measured to be 2.88 Å/cycle for the first 700 cycles (total film thickness of 150 nm). In this disclosure, we also introduce the use of VUV lamps into the ALD process for the purpose of promoting radical production and improved growth rates.

Figure 1:
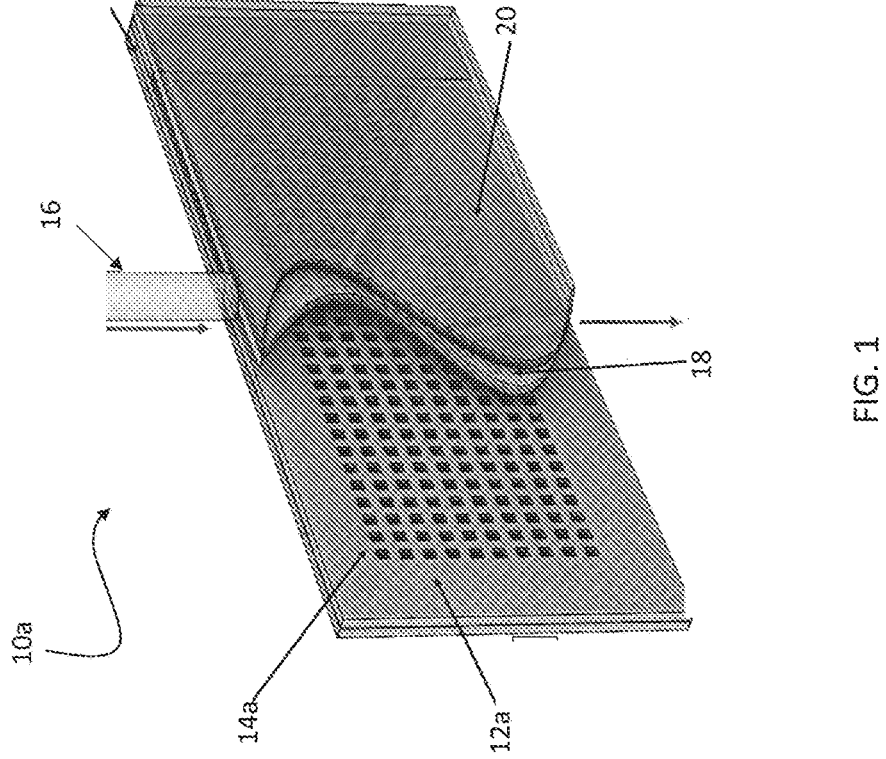
FIG. 1 is a partial diagram illustrating an in-chamber plasma source formed by microplasma cavity arrays for dissociating ALD precursors in a preferred plasma reactor of the invention.
Figure 2:
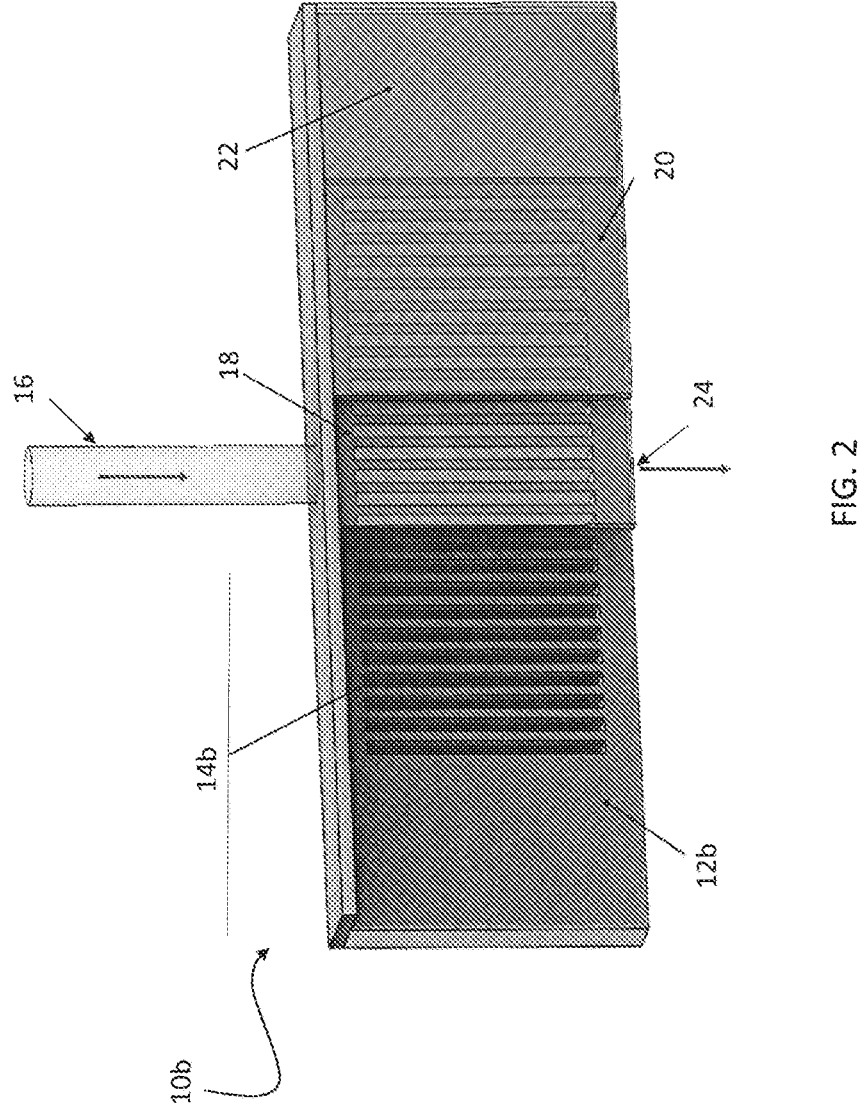
FIG. 2 is a partial diagram illustrating an in-chamber plasma source formed by microplasma channel arrays for dissociating ALD precursors in a preferred reactor of the invention.

Preferred embodiments of the invention will now be discussed with respect to the drawings and experiments used to demonstrate the invention. The drawings may include schematic representations, which will be understood by artisans in view of the general knowledge in the art and the description that follows. Features may be exaggerated in the drawings for emphasis, and features may not be to scale FIG. 1 shows a preferred in-chamber plasma source 10a for a PEALD reactor of the invention. An array 12a of microcavity plasma devices 14a is preferably square or rectangular but can be any arbitrary shape and formed as a thin sheet of metal oxide with a buried metal electrode. The microcavities themselves can be circular, rectangular or square in cross-section. FIG. 2 shows a similar preferred in-chamber plasma source 10b for a PEALD reactor that includes an array 12b of microchannel plasma devices 14b.

In FIG. 2, the microchannels may be oriented parallel or orthogonal to the flow of the incoming precursor (and feedstock or carrier gas, if necessary). The latter orientation will increase the residence time in the plasma reactor and therefore improve dissociation rates further (relative to conventional technology). Precursor (reactant) such as TMA and TMG flows through the microplasma device (without plasma ignition) and reaches to the substrate. Plasma is generated when oxygen (precursor but co-reactant or a carrier gas that is a plasma medium) is passing through microplasma device. The width and depth of these microcavities and micro channels are preferably in the range of 10-900 μm and 10-100 μm, respectively. Remaining features of the arrays 12a and 12b are the same and will be discussed together. The arrays can be fabricated, for example, as provided in Eden et al., U.S. Pat. No. 8,890,409, Microcavity and Microchannel Plasma Device Arrays in a Single, Unitary Sheet; Eden et al., U.S. Pat. No. 8,004,017, Buried circumferential electrode microcavity plasma device arrays, electrical interconnects, and formation method; U.S. Pat. No. 8,456,086, Microcavity plasma devices with non-uniform cross-section microcavities; U.S. Pat. No. 8,404,558, Method for making buried circumferential electrode microcavity plasma device arrays, and electrical interconnects, and other Eden group patents.

Figure 3:
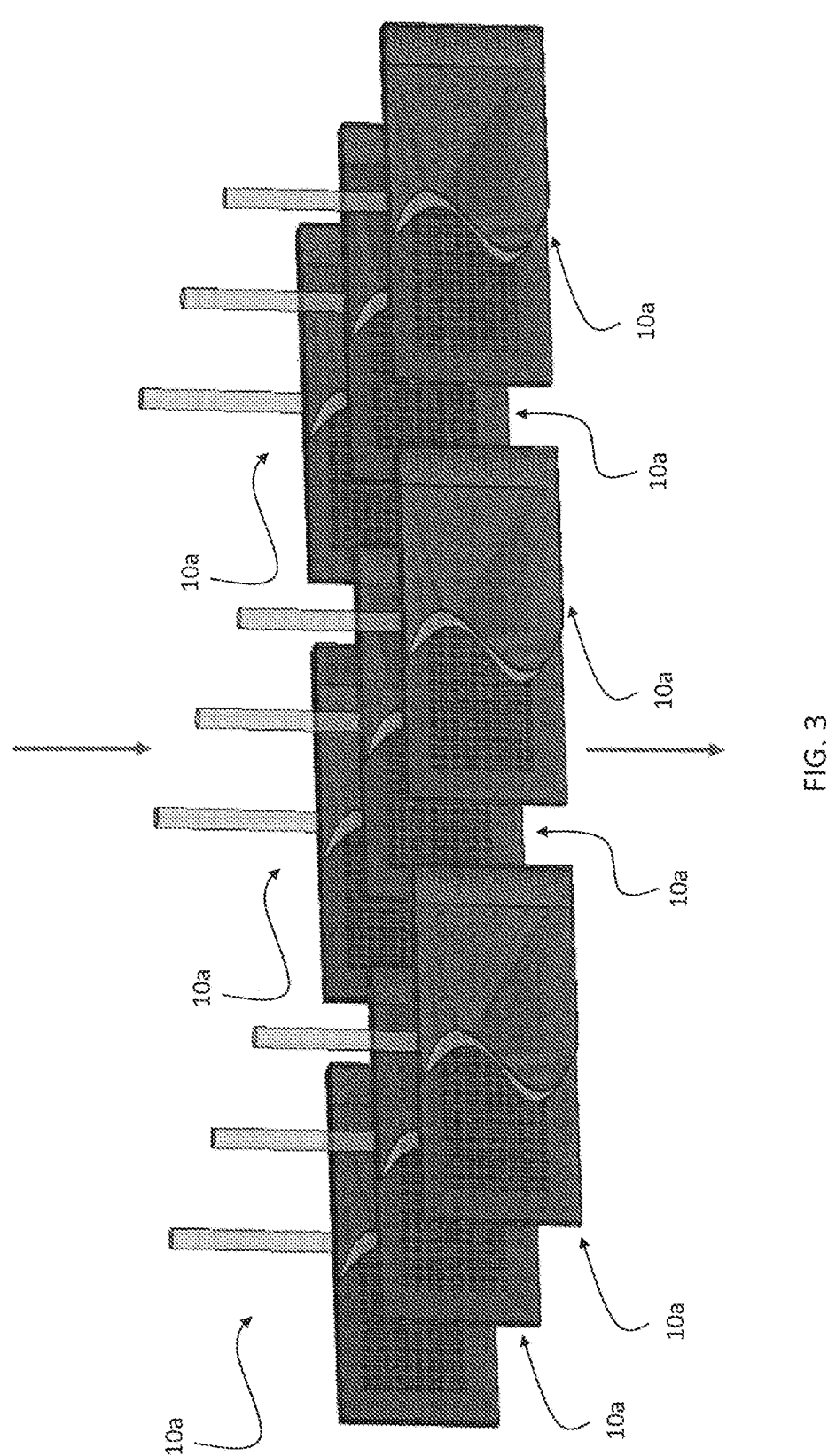
FIG. 3 is a partial diagram illustrating an arrangement of an in-chamber plasma source formed by multiple microplasma cavity arrays for dissociating ALD precursors in a preferred reactor of the invention.
Figure 4:
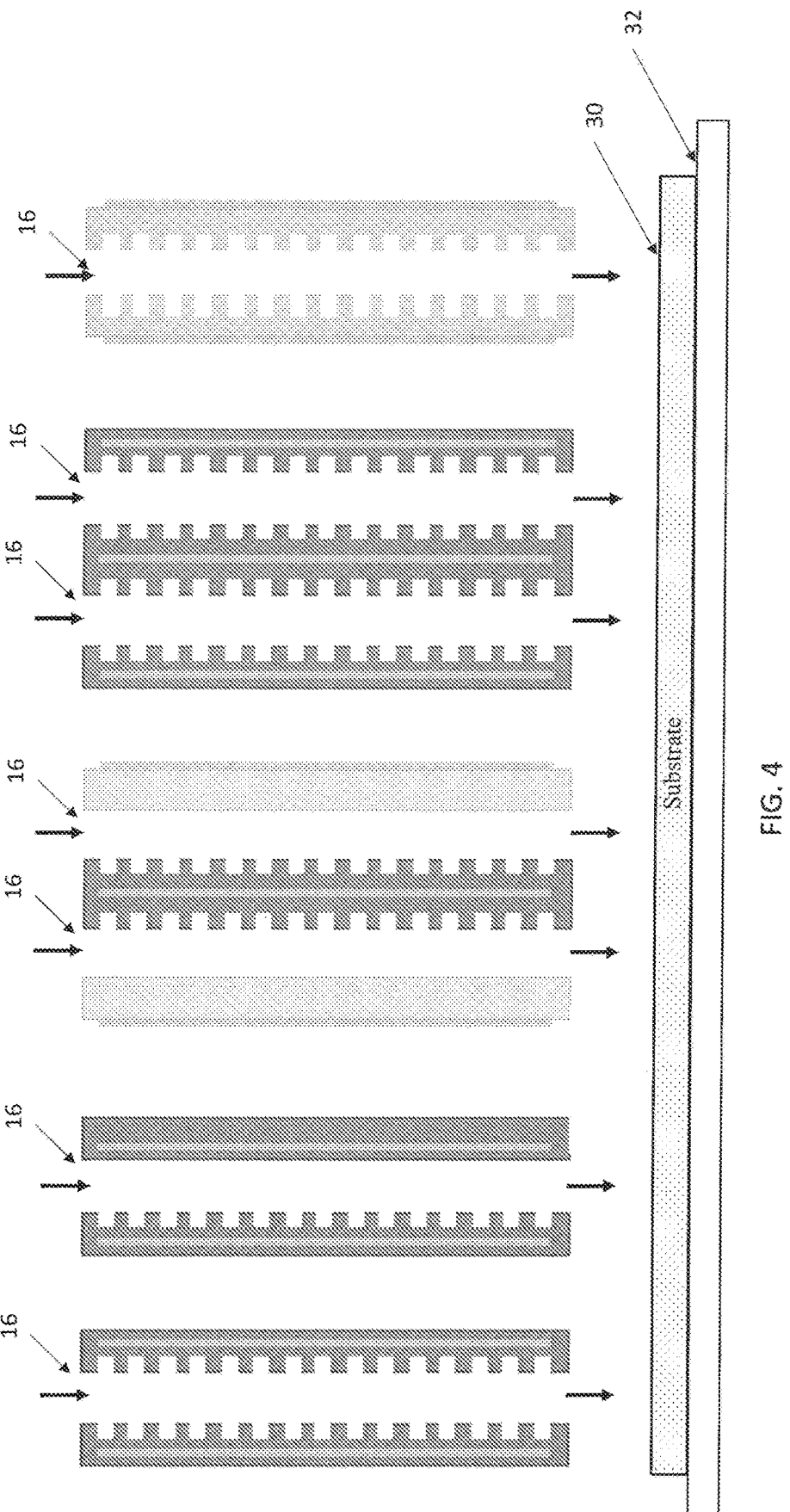
FIG. 4 is a schematic diagram illustrating an arrangement of an in-chamber plasma source formed by a multiple microplasma cavity arrays with respect to substrate for ALD deposition in a preferred reactor of the invention.

The precursor is introduced by an inlet tube 16 positioned at the top of the array 12a or 12b. The gas or vapor then enters a region between the microcavity array and a dielectric cover 18, which isolates a top (or counter) electrode 20 from plasma generated in the microcavities or microchannels. A first electrode is fabricated buried within a metal/metal oxide (e.g. aluminum/alumina or titanium/titanium dioxide) sheet of the array 12a or 12b that houses the microcavities 14a or microchannels 14b. The space between the microcavity or microchannel array 12a or 12b and the top electrode 20 is determined by a spacer 22 and the dielectric cover sheet 18. This design can be referred to as a Dielectric Barrier Discharge (DBD) system. After the precursor is dissociated within the plasma produced by the microcavities or microchannels and the applied, time-varying voltage, the fragments exit the array via an outlet 24 at the bottom and then impinge upon the surface of interest. FIG. 3 shows that multiple microplasma arrays can 10a can be combined to form a group for a reactor to provide larger scale processing. FIG. 4 shows the inner chamber of a preferred reactor with multiple plasma arrays be positioned above a substrate 30 on a substrate holder 32 within the deposition chamber, which permits fabrication spatially-uniform films over a large substrate area. FIG. 4 also shows a variation in which arrays of microcavities 12a oppose each other with the inlet tube 16 providing ALD precursors between the opposing arrays. In example experimental reactors, 20×50 arrays of microcavities and arrays of microchannels are fabricated in chemically-grown, nanoporous alumina by a laser tool.

In FIGS. 1-4, at least one electrode is embedded within an alumina/aluminum sheet that also contains the microcavities or the microchannels. A person of skill in the art will recognize that the various designs have advantages with respect to the total gas flow that can be accommodated (and, therefore, the radical production rate per unit time), as well as, cost and size. It must also be emphasized that a wide range of geometries are available for the plasma reactor. As one example (not illustrated), the microcavity array may be disposed in a plane that is orthogonal to the gas flow. Often known as a "showerhead" arrangement, this geometry subdivides the flow of the incoming gas or vapor and then re-directs the flow out of the plasma reactor through an array of orifices. Prior to exiting through the orifice, the gas or vapor interacts with a microcavity located directly opposite each orifice.

The plasma ignition voltage for the arrays of FIGS. 1-4 will be determined by several factors, including the spacer thickness and the pressure of precursor/feedstock gas or vapor. In experiments conducted to date, the pressure in the deposition chamber ranges from several millitorr to 150 Torr. The microplasma arrays function very well over this entire range. To note, local pressure within the microcavities and microchannels will be considerably higher than the tool background value. When the arrays are driven by a sinusoidal voltage, the typical magnitude is 700 V RMS.

Figures 5A, 5B:
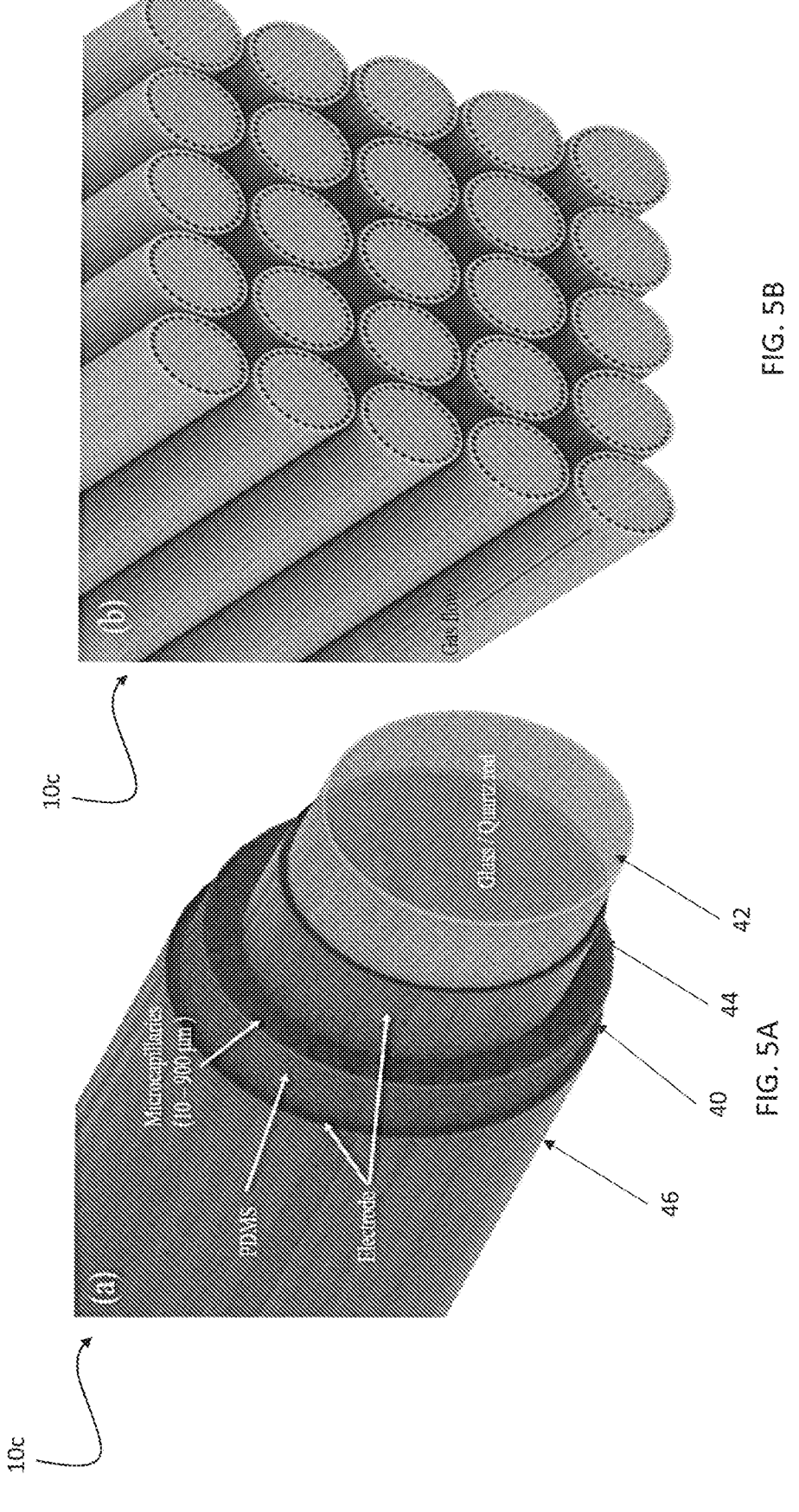
FIGS. 5A and 5B are partial views of a single and array of a cylindrical geometry microplasma device array formed around the periphery of a quartz (silica) or glass rod, or optical fiber for a preferred reactor of the invention.
Figures 6A, 6B:
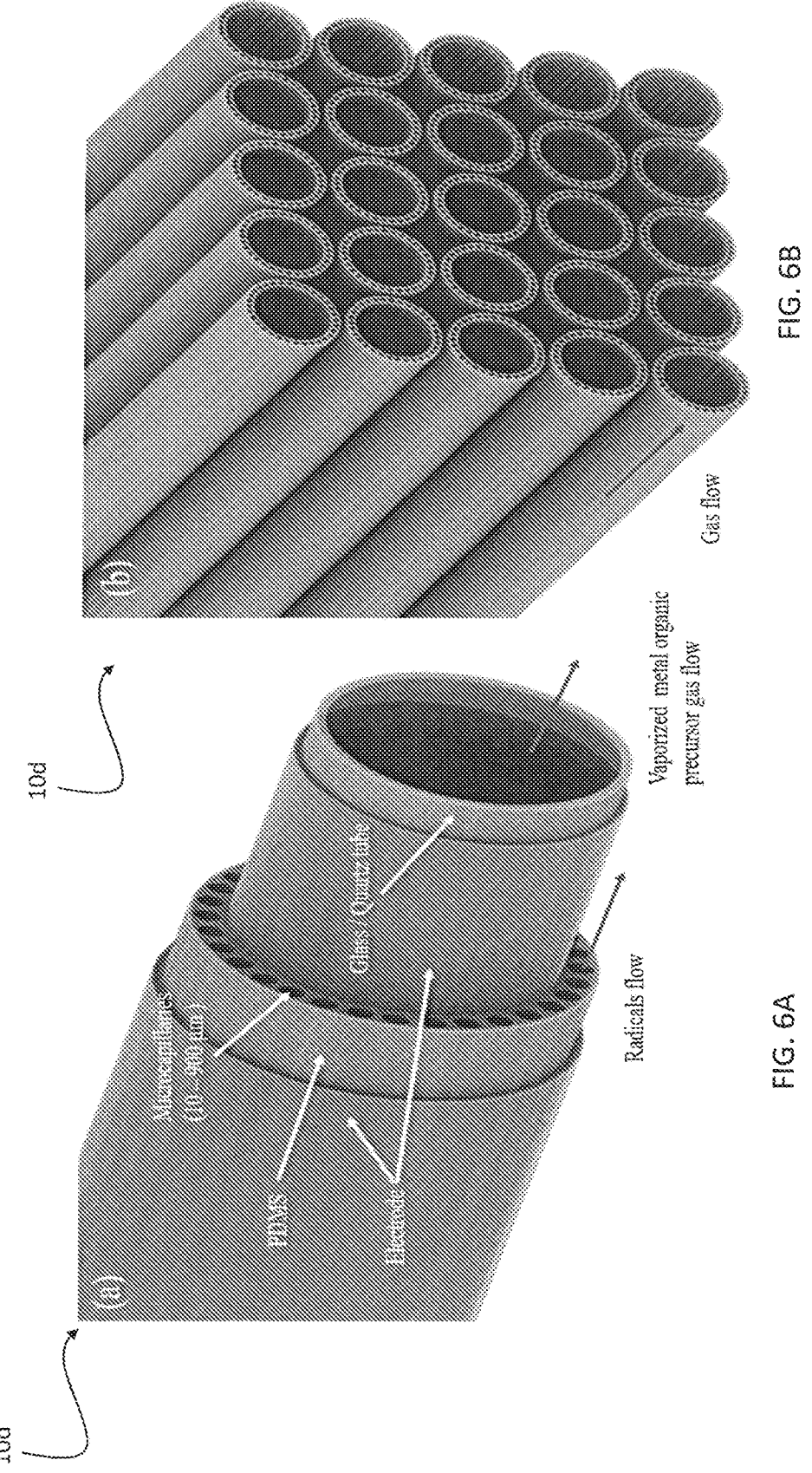
FIGS. 6A and 6B are partial views of a single and array of a cylindrical geometry microplasma devices with a center precursor delivery channel for a preferred reactor of the invention.

FIGS. 5A, 5B and 6A, 6B show additional geometries of in-chamber plasma sources 10c and 10d. In these arrangements, plasma is produced in an array of microcapillary microchannels 40 that are cylindrical and arranged azimuthally around an inner cylinder 42. As shown in FIGS. 5B and 6B arrays can be grouped to form a larger array. The microcapillaries 40 can be fabricated in a polymer such as PDMS by replica-molding. An inner electrode 44 is formed on the core and an outer electrode 46 is formed on the PDMS layer. The plasmas are generated by applying a time-varying voltage across the two cylindrical electrodes 44 and 46. In FIGS. 5A and 5B, the inner cylinder 42 is a solid core and capillary plasmas are generated in the precursor flow that flows through the microcapillaries 40. Preferably, the inner cylinder 42 is glass, quartz rod, or fiber that serves to transmit optical fluorescence, produced by the discharges, to a spectrometer lying outside the reactor chamber. Such a solid optical rod is useful to measure the in-situ spectrum analysis when plasma is generated inside the tube. Quartz is preferred as a stable material against metal-organic or high energetic plasma ignition In FIGS. 6A and 6B, the inner cylinder is a hollow tube and precursor flows through the hollow tube. In FIGS. 6A and 6b, plasmas in the microcapillaries 40 are formed in a plasma medium such as a rare gas, e.g. helium or argon. The array of microplasmas emanating from the microcapillaries in FIGS. 6A and 6B interacts with the flow of precursor out from the hollow tube, resulting in the fragmentation of the precursor immediately above the substrate.

Figure 7:
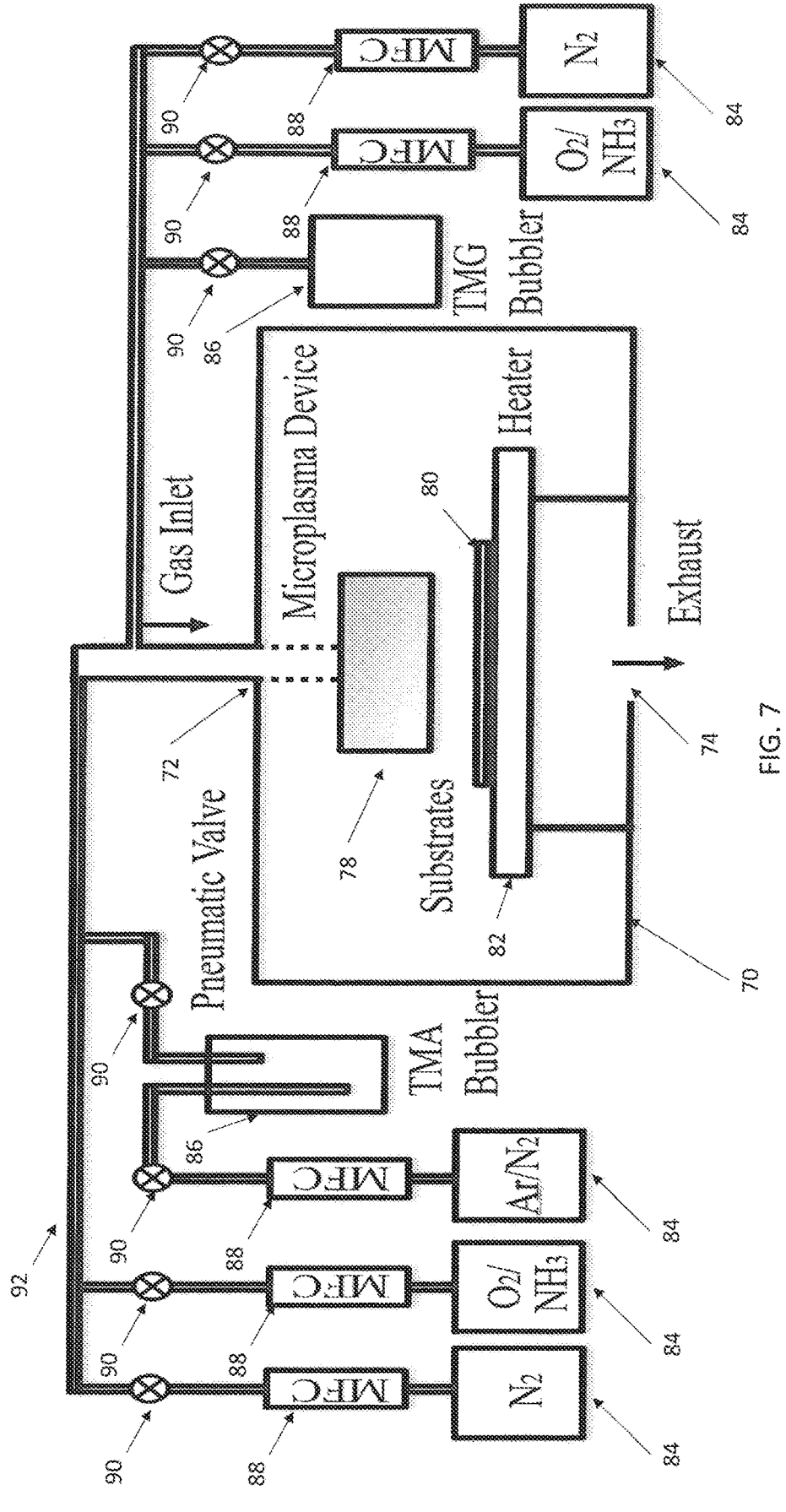
FIG. 7 is a schematic diagram illustrating a preferred plasma enhanced ALD reactor of the invention.

FIG. 7 shows a preferred PEALD reactor system 70 that is consistent with an experimental arrangement employed to date. The system includes a reactor chamber 72 with one or more inlets 74 and an exhaust 76. On or more in-chamber plasma sources 78 (constructed as an of 10a, 10b, 10c, or 10d of FIGS. 1-6B) is positioned above a substrate 80 that is upon a holder 82 which can include a heater. The distance between the in-chamber plasma sources 78 and the substrate is preferably close, typically 30 mm, but the separation does not appear to be critical to obtaining optimal results and a range of 2 to 10 cm can be used. The system 70 includes a plurality of gas sources 84, precursor bubblers 86, mass flow controllers (MFC) 88 and valves 90. All of the valves and mass flow controllers are computer-controlled as in conventional commercial reactors and deliver appropriate ratios, pressures, and sequences of precursors and carriers via conduit 92 to the one or more inlets 74. In experiments that were conducted, when TMA or TMG (trimethylgallium) were introduced to the reactor, the vapor pressure of these organometallics was 9 and 170 Torr, respectively, which can be in ranges used in present commercial processes. Precursors and precursor pressures used in prior ALD and vapor deposition processes can be used the present reactor system and many material systems will benefit from the in-chamber plasma source of the present reactor system.

Figures 8A, 8B:
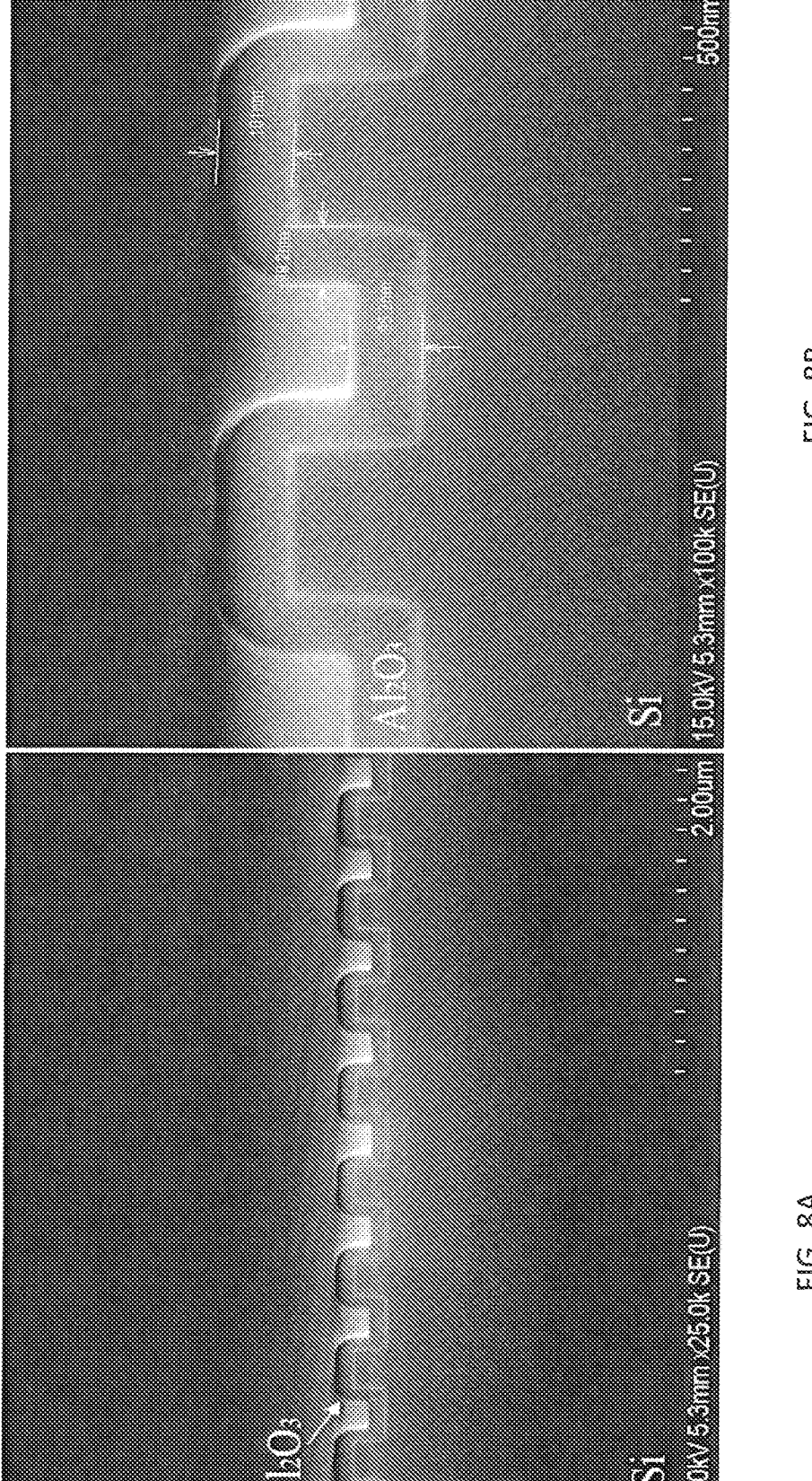
FIGS. 8A and 8B are SEM diagrams at different magnifications of an $Al_2O_3$ film deposited onto a commercial Si substrate having a 200 nm rib structure at its surface.
Figures 9A, 9B:
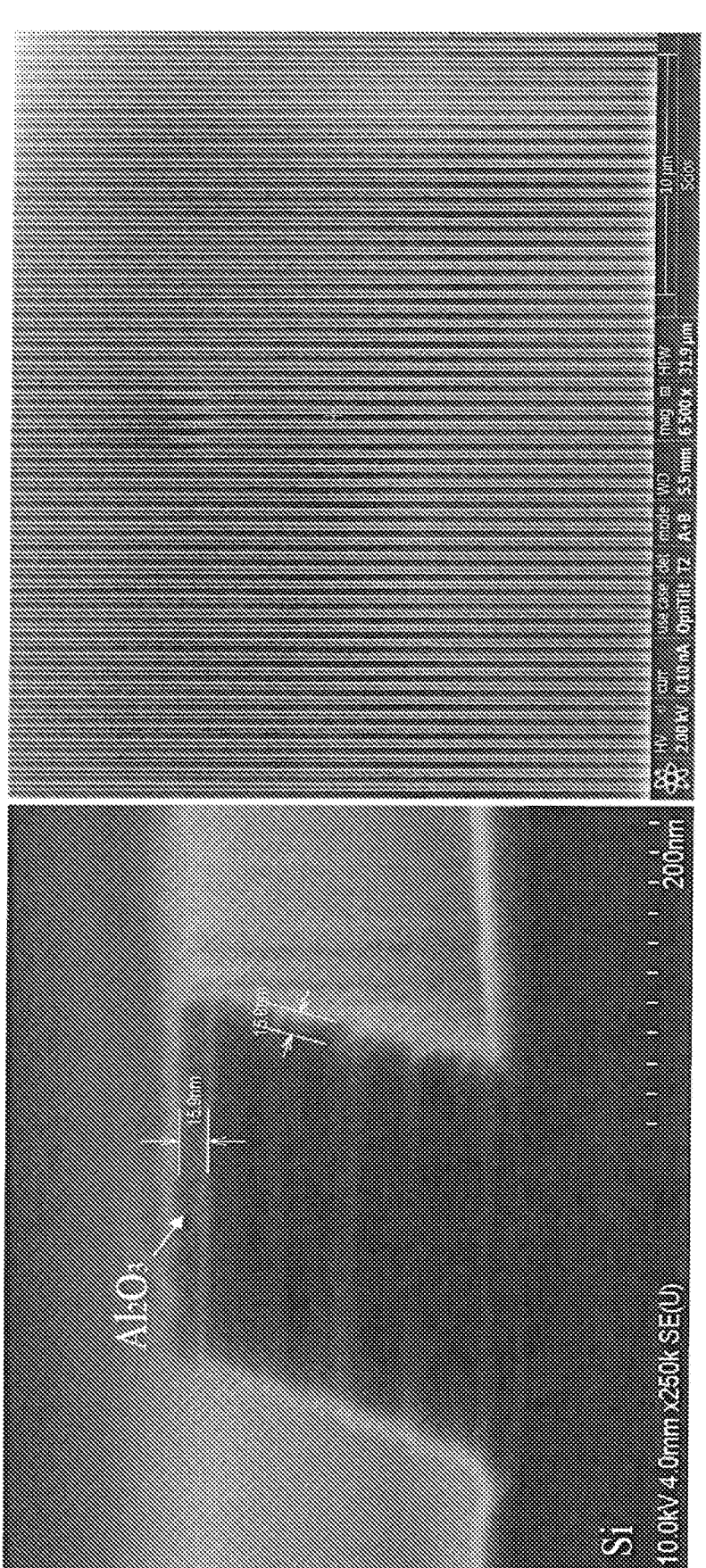
FIGS. 9A and 9B are respective cross-sectional and top view SEM diagrams at different magnifications of 15 nm thick $Al_2O_3$ film grown onto an array of "leaning" Si barriers.

FIGS. 8A-9B present scanning electron micrographs (SEMs) of aluminum oxide ($Al_2O_3$) films grown on different silicon substrates in experiments using a reactor system consistent with FIG. 7. In FIG. 8A, the substrate has a ribbed structure over which the alumina films were grown. It is immediately evident from FIG. 8B that the $Al_2O_3$ film is not only thin (nominal thickness of 100 nm) but conformal over the Si barriers and in the trenches as well. In conventional ALD, the deposition rate (and resulting film thickness) is often lower on the sidewall of a trench than it is on the top. This is not the case here. Furthermore, residual stress in thin films gives rise to the formation of cracks and hillocks in the film which are capable of degrading the operation of electronic devices. In all of the films grown to date, we have observed no evidence of either cracks in the films or hillocks. In FIGS. 9A and 9B, an alumina film, only 15 nm in thickness, has been grown onto Si barriers that have been intentionally fabricated so as to "lean" to the right. Thicker films can be grown by simply increasing the number of cycles. FIGS. 9A and 9B illustrate the precise control of film thickness at the sub-20 nm scale that can be achieved with this technology. Because of the conformality and step coverage that this new PEALD process offers, methods and systems of the invention can be of great value in VLSI manufacturing and development.

Figure 10:
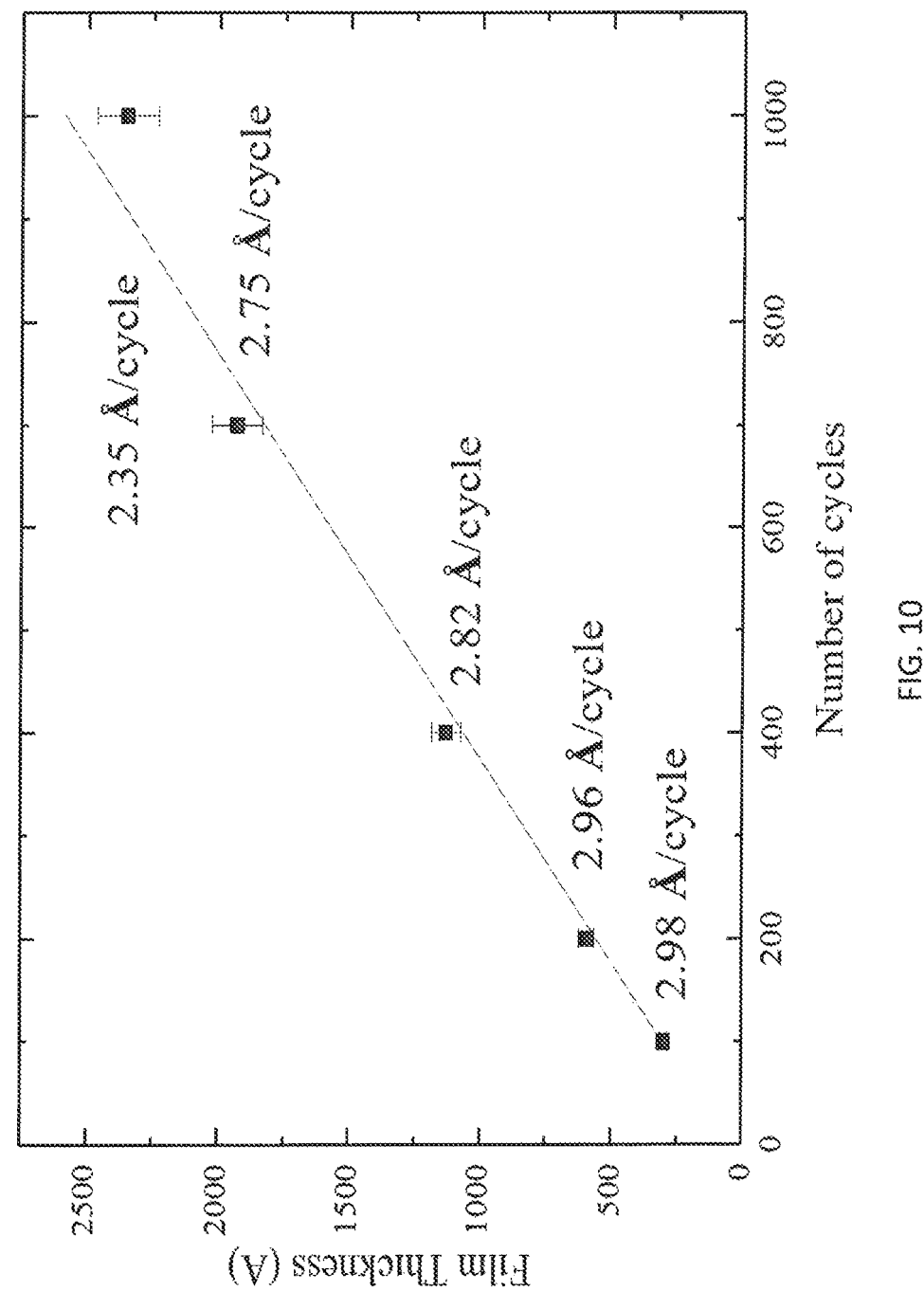
FIG. 10 is plot of the thickness of $Al_2O_3$ films as a function of the number of plasma enhanced ALD (PEALD) growth cycles where point represents an average of 5 measurements.
Figure 11:
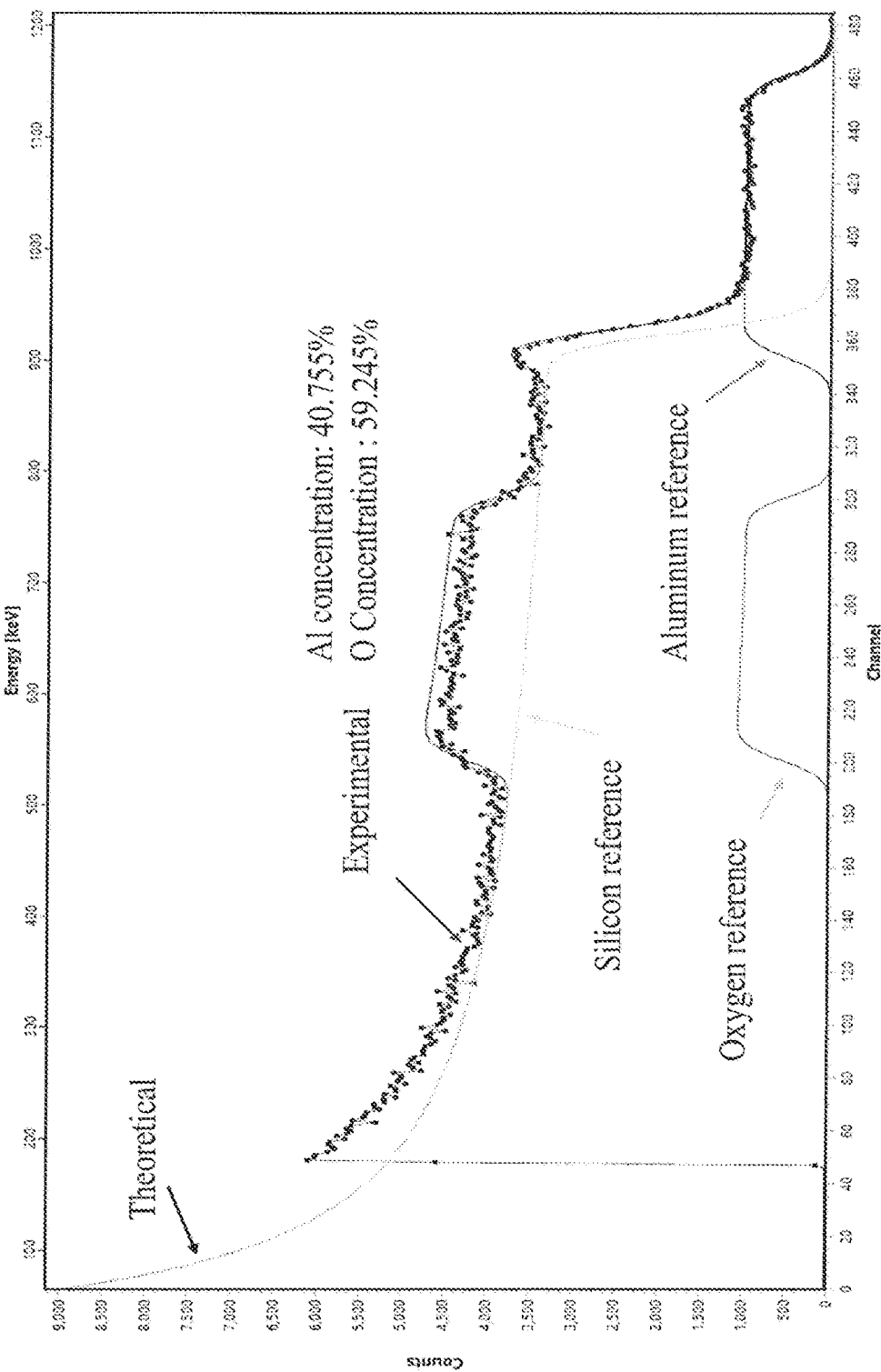
FIG. 11 is the Rutherford Backscattering Spectrometry (RBS) spectrum for an $Al_2O_3$ film grown on Si by PEALD.
Figure 12:
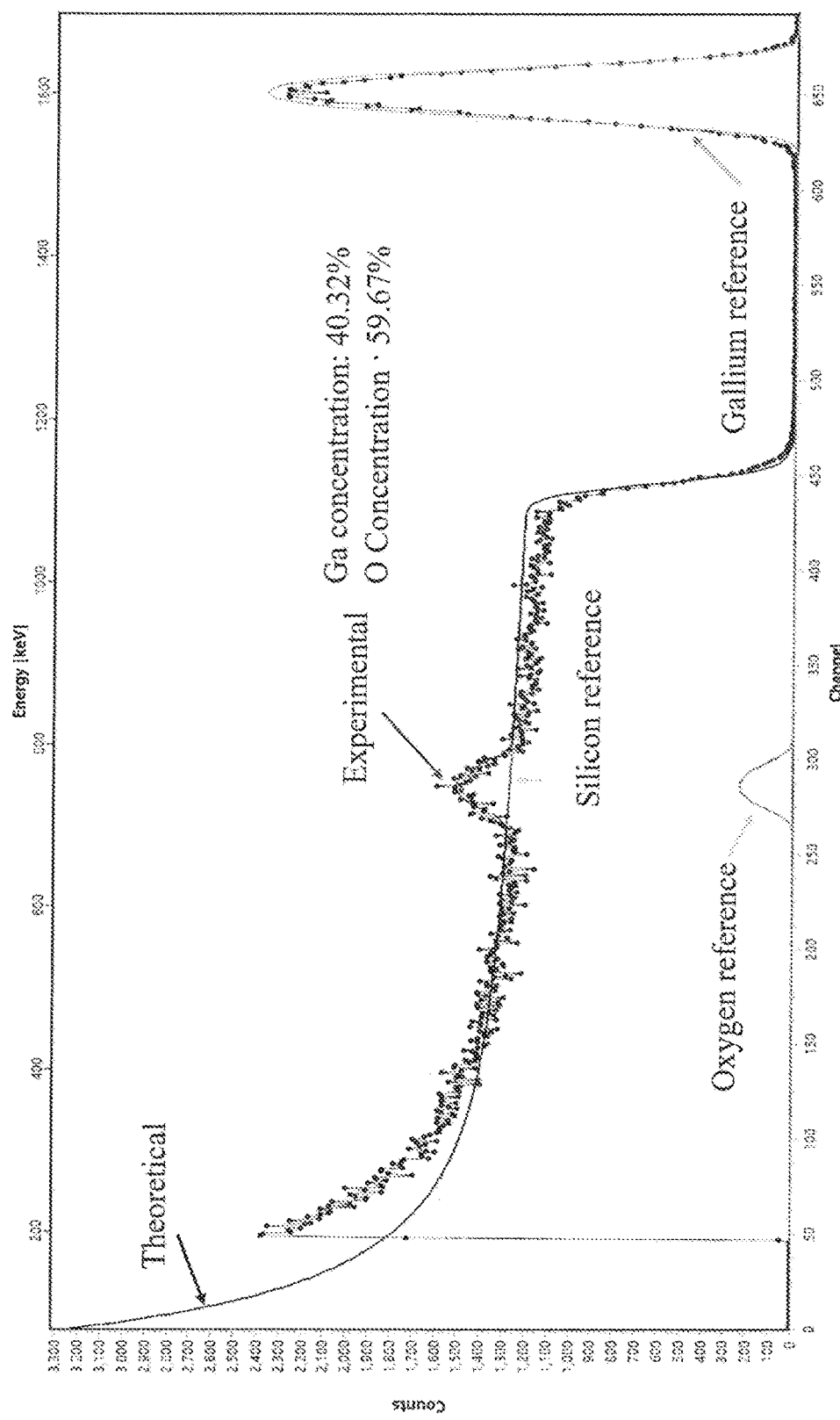
FIG. 12 is the Rutherford Backscattering Spectrometry (RBS) spectrum for a PEALD $Ga_2O_3$ film.

Measurements of the thickness of aluminum oxide films as the number of cycles is increased is summarized in FIG. 10. Two aspects of these results should be mentioned. The first is that the film thickness is linear as the number of cycles increase up to approximately 700 cycles. Beyond 700 cycles, the onset of saturation is apparent. Of greater importance is that the mean film growth rate throughout this region (1-700 cycles) is 2.88 Å/cycle. This value is precisely the maximum value attainable if a single, complete monolayer is grown with every cycle. We believe this to be very significant because most conventional ALD processes yield growth rates that are 50% or less of the maximum value, which is determined by the physical size of the atoms being deposited. ALD growth rates well below the maximum indicate that the growth of the monolayer is not complete after one cycle. Rather, gaps and other defects are present in the film which can be partially remedied by subsequent cycles. In contrast, the data obtained in experiments using a system of the invention to grow aluminum oxide, in particular, shows that a complete monolayer is being grown every cycle of the ALD process. Further support for the quality of the grown films is provided by the Rutherford Backscattering Spectrometry (RBS) trace shown in FIG. 11. Comparison of these data relative to atomic standards shows that the composition of the film is 40.76% and 59.24% for Al and oxygen, respectively. This is precisely what one would expect for stoichiometric aluminum oxide films and the simulation of $Al_2O_3$, shown as the solid curve in FIG. 11, which confirms that the film is high quality aluminum oxide. Similar data were obtained for Gallium Oxide ($Ga_2O_3$: cf. FIG. 12). Surface analysis of both Al and Ga-oxide films also showed the presence of negligible levels of impurities such as carbon and hydrogen. As an additional test of film quality, $Ga_2O_3$ films were grown on Si and gold electrodes were deposited onto the back side of the Si wafer and the surface of the gallium oxide film, thereby forming a capacitor. Measuring the hysteresis in the V-I characteristics of gallium oxide capacitors at several frequencies is a widely-accepted test for determining the quality of such films. Our measurements show that the magnitude of the hysteresis in our films is approximately 150 mV, which places our films among the best ever reported.

Figures 7, 13:
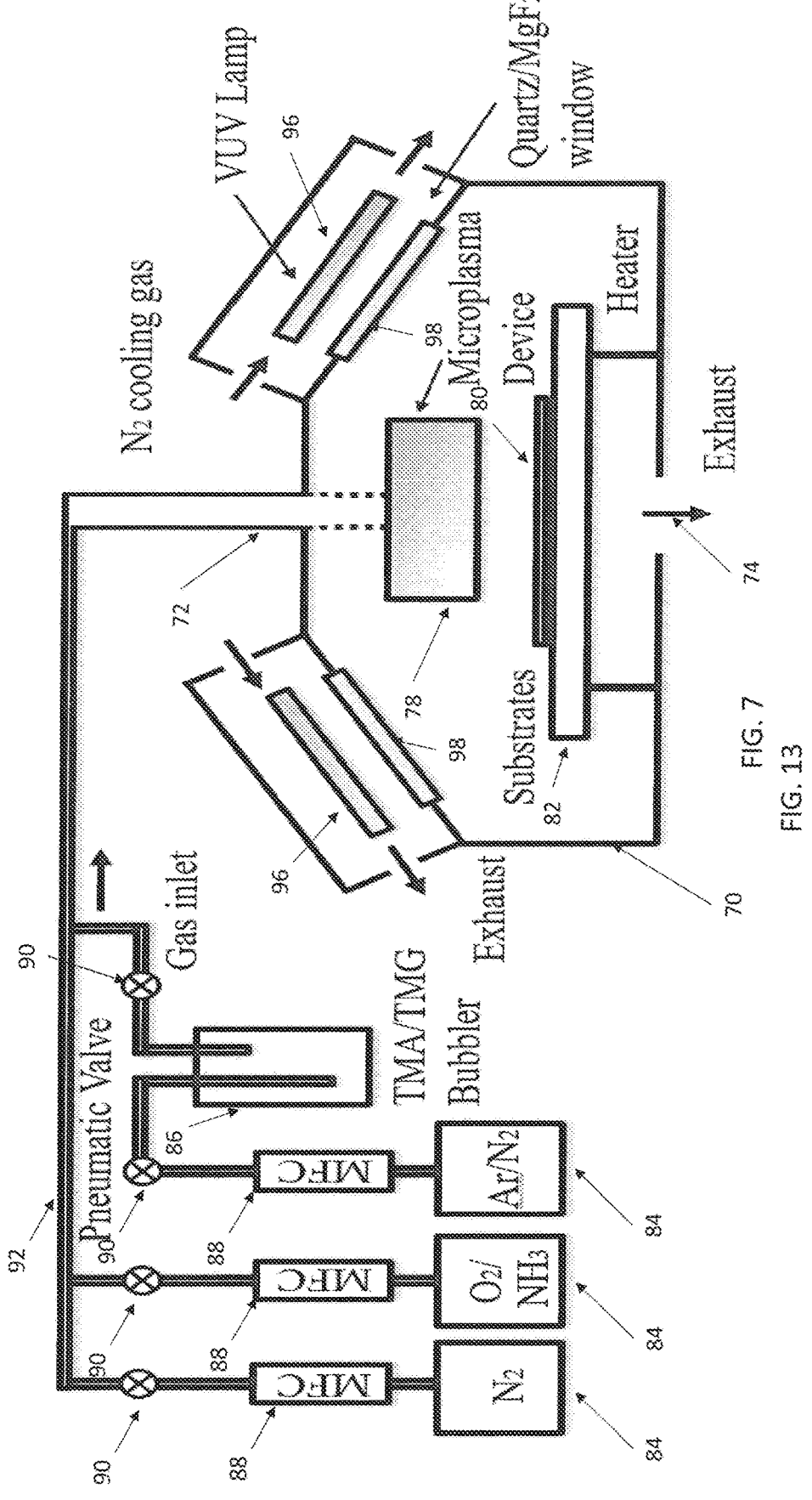
FIG. 13 is a schematic diagram illustrating a preferred plasma enhanced ALD reactor of the invention including UV/VUV lamps (or arrays thereof) for the purpose of accelerating precursor decomposition, dissociating physisorbed or chemisorbed species on the substrate surface and enhancing adatom mobility.

FIG. 13 show another reactor system based upon FIG. 7 and including VUV Lamp-sources 96 that provide irradiation into the chamber 74 via windows 98. Common features use the same reference numbers used in FIG. 7. In this arrangement (not drawn to scale), preferably at least two VUV lamps 96 irradiate a surface of the substrate 80 and/or the region immediately above the substrate. These lamps 96 may emit the same or different wavelengths but will typically generate radiation in the wavelength region below 250 nm. Initial experiments focus on flat lamps emitting at 172 nm. To provide for the rapid replacement of the lamps, the window 98 fabricated of high quality (low absorption) magnesium fluoride ($MgF_2$), sapphire, or fused silica, depending on the wavelengths emitted by the lamp, is mounted onto the wall of the deposition chamber 74 so as to allow radiation from the lamp to enter the chamber. The choice of the optimal wavelength of the lamp(s) will be determined by the absorption spectrum of the precursors because one function of the lamps is to enhance the dissociation of strongly-bound precursors such as ammonia and oxygen. These molecules and others are known for their strong bond energies which limits the degree of dissociation of a stream of such molecules, even in a plasma. However, VUV lamps, in particular, emit photons having sufficient energy to break many of the strongest bonds. Ammonia, for example, absorbs strongly at 172 nm and the absorption of a single photon by the molecule is known to produce an electronically excited amidogen ($NH_2$) radical. The hydrogen atom released in this process interacts with other ammonia molecules, releasing their hydrogen atomic ligands. The result is that the ammonia in the reactor "unravels" more quickly with the 172 nm photons than is the case with plasma alone. For this reason, the reactor design of FIG. 13 is especially effective in the growth of metal-nitride films such as the photonic materials GaN and AlN. Another function of a UV/VUV lamps is to enhance adatom mobility and, for this process, the optimal wavelength of the lamp will be in the 190-230 nm region.

Figures 14A, 14B, 14C:
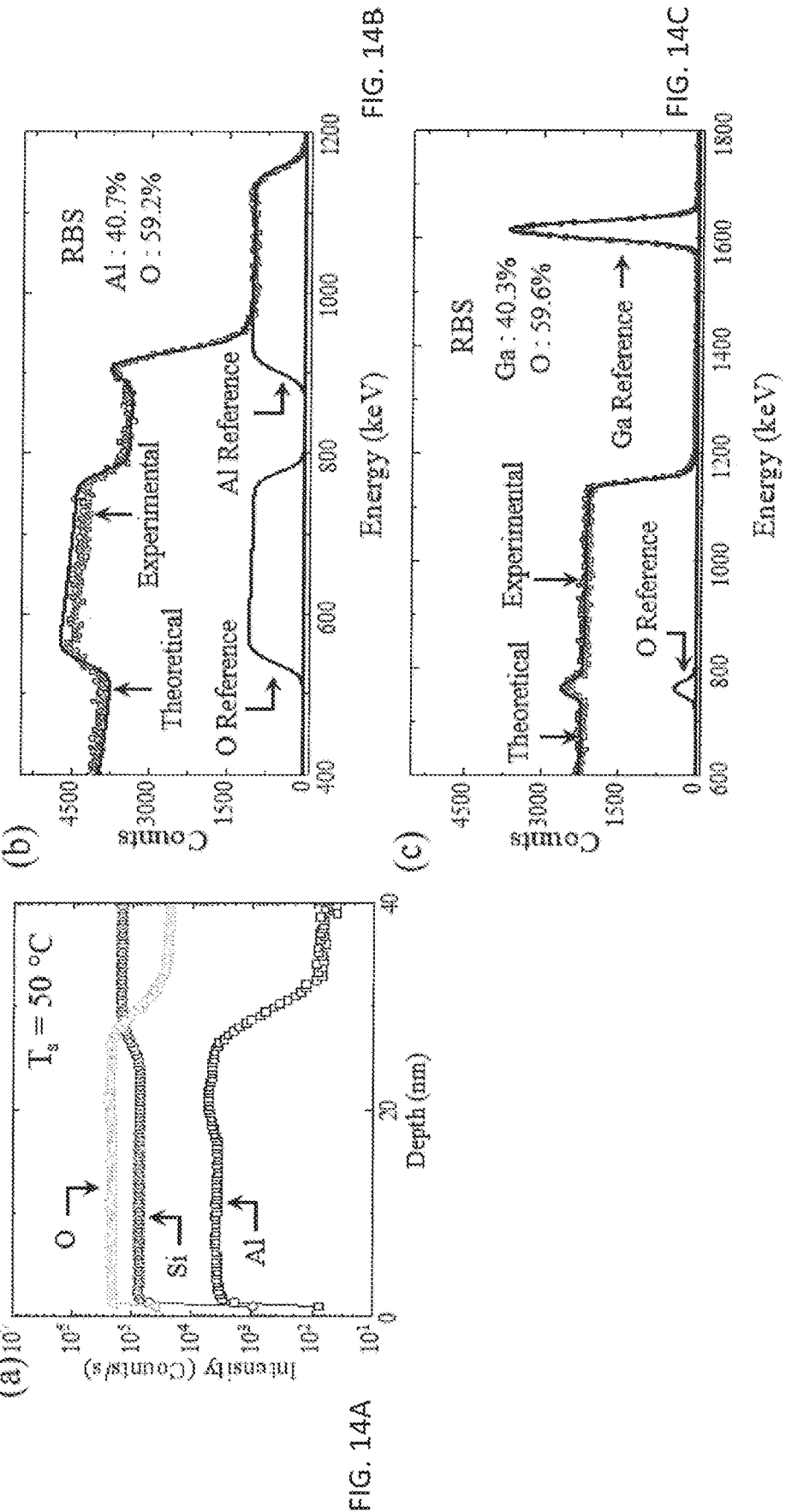
FIG. 14A shows an element in-depth distribution profile form SIMs in 30 nm-thick $Al_2O_3$ film deposited on Si substrate.
FIG. 14B shows the RBS spectrum for a 30 nm-thick $Al_2O_3$ film.
FIG. 14C shows the RBS spectrum of $Ga_2O_3$ thin film after using ~10000 cycles of TMA precursor use.

In experiments, the thin film chemical composition of deposited films was investigated and is represented in FIGS. 14A-14C. Characterizing the in-depth distribution of $Al_2O_3$ thin film was performed from Time-of-Flight Secondary Ion Mass Spectrometry (ToF-SIMs), providing elemental chemical states and molecular information from surface of sample to substrate. FIG. 14A illustrates SIMs analysis in deposited $Al_2O_3$ thin film on Si substrates. The intensity of Al and O elements are relatively higher in 30 nm depth and Si elements increases thereafter. This result indicates $Al_2O_3$ thin film was well uniformly deposited layer by layer with less contamination at Ts=50° C. Chemical composition of the grown films was further measured by the Rutherford Backscattering Spectrometry (RBS) trace as illustrated in FIG. 14B. Comparison of these data relative to atomic standards shows that the composition of the film is 40.7% and 59.2% for Al and O, respectively. This is precisely what one would theoretically expect for stoichiometric aluminum oxide films and the simulation of $Al_2O_3$, shown as the solid curve in FIG. 14B. The film consists of high-quality aluminum oxide, indicating the presence of negligible levels of impurities such as carbon and hydrogen. After ~10000 cycles of TMA use in this experiment, trimethylgallium (TMG) was used to deposit gallium oxide thin film in order to verify any unwanted Al contamination from TMA or sputtering Al elements from microplasma device, composed of nanoporous $Al_2O_3$. FIG. 14C indicates $Ga_2O_3$ thin film deposited on Si substrate at $T_s$=50° C. The average O/Ga ratio is 1.47±0.10 without Al element.

In additional experiments, $Ga_2O_3$ thin film uniformity and conformality was investigated. Ultrathin electronic films were grown in the FIG. 7 reactor system. Various thickness of a-$Ga_2O_3$ thin films were deposited on p-Si, quartz, and PET substrate in the FIG. 7 systems at RT. The reactor system composed of home-made reactor and gas delivery system with distinct plasma source which can be ignited with 35 kHz AC power. All deposition processes of were programmed in a vertical hot wall reactor according to FIG. 7 with three mass flow controllers and three pneumatic valves, programmed for automation. The substrates were ultrasonically cleaned in acetone, IPA, deionized water and IPA in sequence. Before deposition process, the reactor was maintained vacuum pressure 15 mTorr. TMG cylinder temperature was kept in canister at 5° C. since TMG has a high vapor pressure. The PEALD process was performed at a working pressure of 5-50 Torr. PEALD consists of four steps: 1) exposure of the substrate to a precursor such as trimethylgallium (TMG: 99% Strem Chemicals) for 10-50 ms which leads to the first layer of atoms deposited onto the underlying substrate; 2) purging of the excessive precursor molecules with 5N grade 200 sccm $N_2$ from the vacuum chamber; 3) exposure of the new surface to the co-reactant 5N grade 200 sccm $O_2$ in order to complete the growth of the first layer of a compound film, and 4) evacuation of the unused co-reactant molecules with 200 sccm $N_2$ from the reactor. The substrate temperature was maintained at 300 K. After deposition of $Ga_2O_3$ from via the present PEALD, sample was directly transfer to e-beam evaporator. For MSM structure, the top 20 nm gold and 30 nm Ni metal contact was deposited on $Ga_2O_3$ thin film by e-beam evaporator (Temescal FC2000). For the material characterization, the thickness of $Al_2O_3$ film dependence on ALD cycles was determined by Scanning Electron Microscope (SEM: Hitachi S4800) image and variable-angle spectroscopic ellipsometry (J. A. Woollam VASE). Crystallinity of $Ga_2O_3$ thin film was investigated by X-ray Diffraction (XRD: PANalytical Phillips X'PERT MRD). Chemical composition of $Ga_2O_3$ thin film was investigated by iXRF Energy Dispersive X-ray spectroscopy (EDX: ATLAS), Secondary Ion Mass Spectrometry (SIMs: Phi Trift III) and Rutherford Backscattering Spectrometry (RBS). Transmittance dependence on wavelength was analyzed by ultraviolet-visible spectrophotometry (Varian Cary 5G and Agilent Cary 5000). The electrical characterization of DUV photodetector was investigated by equipped with a monochromatic connected to the incident 300 W Xe lamp (Newport). UV light was directly focused and guided onto the device. For more accurate photocurrent response of DUV detector, beside modified Newport monochromators with lamp experimental arrangement, calibrated 222 nm lamp and 254 nm were purchased by Eden Park Illumination Inc and CureUV.com, respectively. Keithley 4200A was used for most of the electrical characteristic measurements. For the high-speed photocurrent response of detector measurement, low noise current preamplifier (Newport) was used with oscilloscope.

Figures 15A, 15B, 15C:
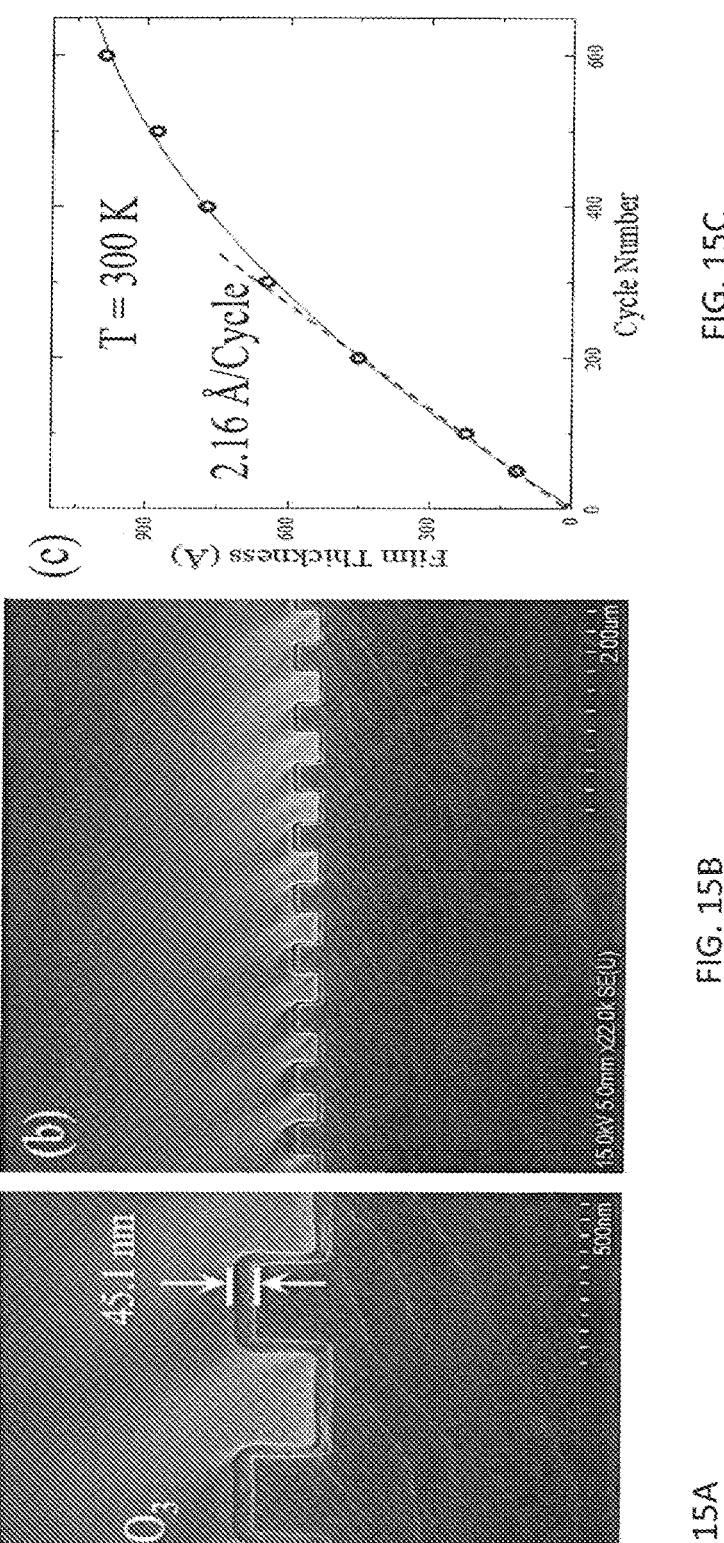
FIGS. 15A and 15B are cross-section SEM images of 15 nm thickness of $Ga_2O_3$ thin film deposited on trench patterned Si at different magnifications.
FIG. 15C is data showing the dependence of the thickness of $Ga_2O_3$ films on the number of growth cycles at RT.

The $Ga_2O_3$ thin film was successfully deposited on patterned silicon with good uniformity and conformality. FIGS. 15A and 15B are SEM images of $Ga_2O_3$ films grown on patterned silicon substrates. In FIG. 15A, the substrate has a periodic trench structure over which 45.1 nm thickness $Ga_2O_3$ films were grown. As illustrated in FIG. 15B in a large scale, there is no formation of cracks and hillocks in the film which can be detrimental to the operation of electronic devices. In addition, unnecessary particles produced during the deposition worsens electronic device performance were not observed. Thus, uniform $Ga_2O_3$ film thickness is controllable as simply increasing/decreasing ALD cycles. FIG. 15C exhibits the average thickness of $Ga_2O_3$ films dependence on the number of ALD cycles at RT (room temperature). The film thickness linearly increases with the number of cycles up to approximately 300 cycles with 2.16 Å/cycle. The growth rate was gradually saturated beyond 300 cycles. In addition, averages growth rate, 2.16 Å/Cycle, is almost the maximum value attainable when the complete monolayer is grown with every cycle. This is very significant because most conventional PEALD/ALD processes yield growth rates that are 50% less than the maximum value at low temperatures.

Figure 16:
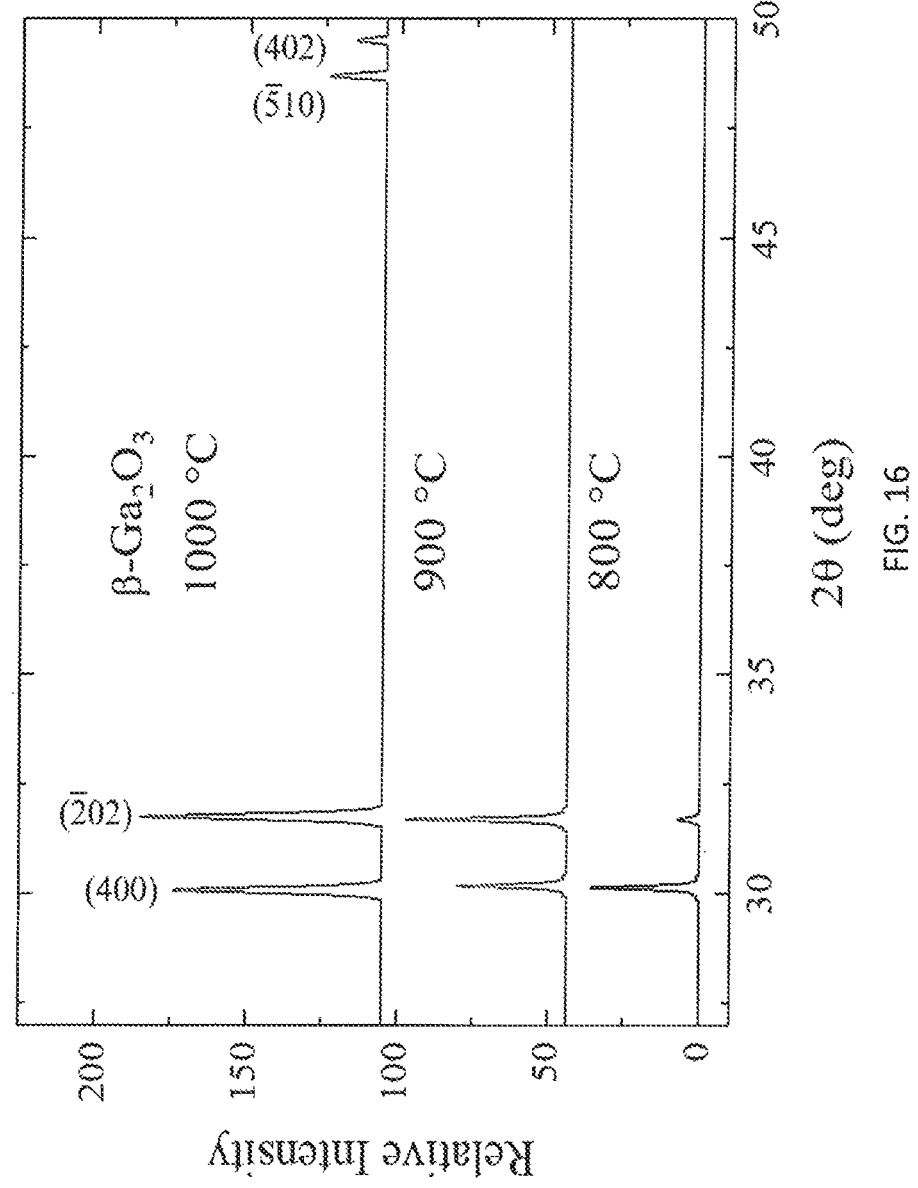
FIG. 16 is XRD 2theta-omega ($2\theta$-$\omega$) spectra of $\beta$-$Ga_2O_3$ grown on Si with various postdeposition annealing temperatures with plots showing 800, 900 and 1000° C. for 20 mins with 2 slm Argon flow, respectively.
Figures 17A, 17B, 17C, 17D:
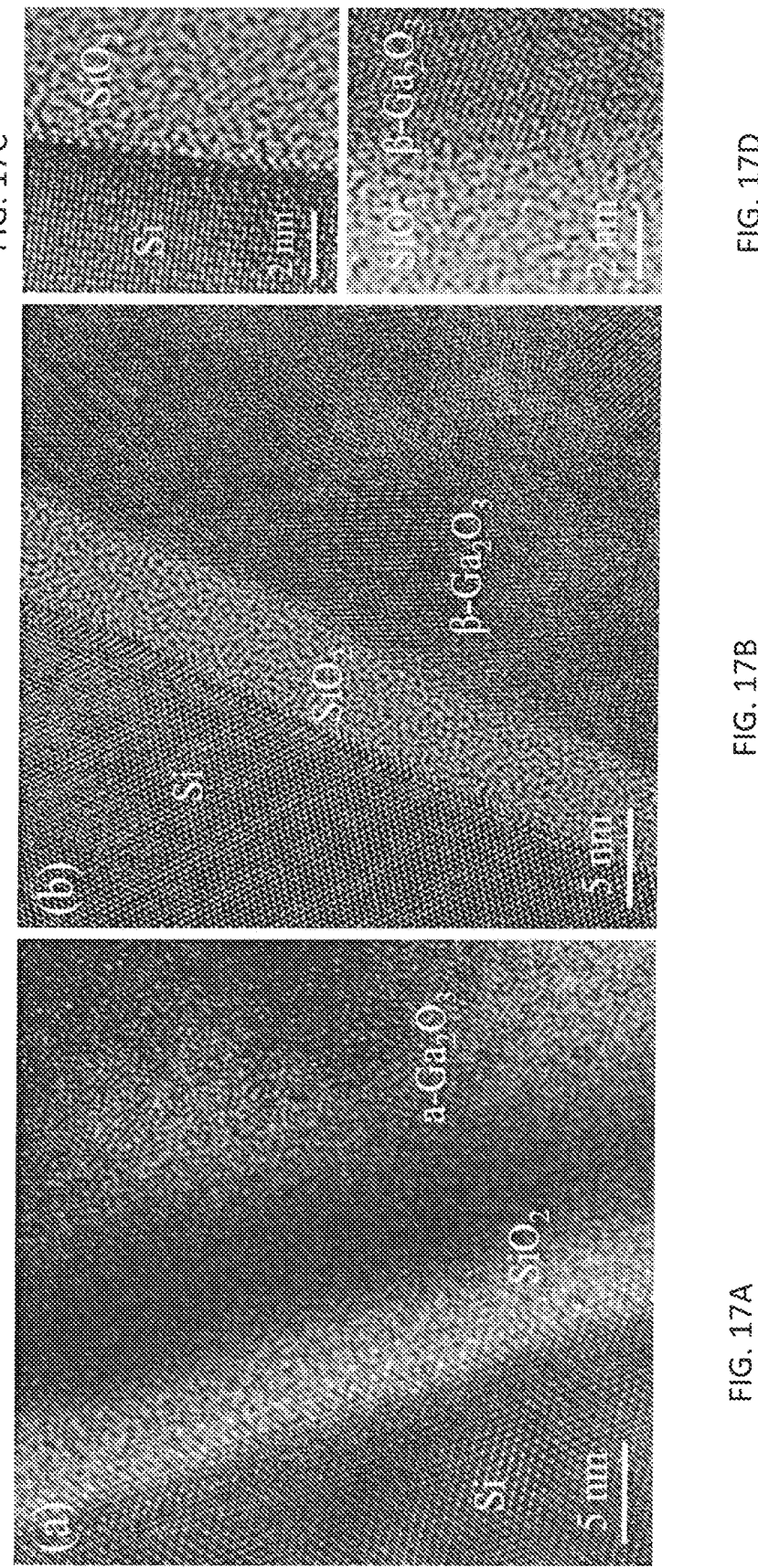
FIG. 17A is a cross-section TEM image of the amorphous $Ga_2O_3$ thin film grown on Si.
FIG. 17B is a TEM image of polycrystalline $\beta$-$Ga_2O_3$ thin film grown on Si at 800° C. post-annealing temperature.
FIGS. 17C and 17D show interface portions of the FIG. 17B film.

Material Characterization of $Ga_2O_3$ thin films grown on Si, Quartz, and PET. FIG. 16 presents $\beta$-$Ga_2O_3$ crystallinity dependence on different post-annealing temperature with Argon ambient in a rapid thermal annealing system. In the experiments, a different chamber was used for RTA. The FIGS. 7 and 13 systems can be modified to include an RTA heater and then RTA can be conducted in-chamber after deposition. Post-annealing was performed with different temperature of 800, 900, 1000° C. for 20 mins. The orientation of $\beta$-$Ga_2O_3$ and crystal structure was analyzed with XRD. The post-annealing process is used to produce $\beta$-$Ga_2O_3$ with a monoclinic crystal structure. Polycrystalline orientation (400) and ($\overline{2}02$) from $\beta$-$Ga_2O_3$ thin film were observed 800-900° C. and additional ($\overline{5}10$) and (402) orientation were observed with 1000° C. annealing. All patterns corresponded to polycrystalline $\beta$-$Ga_2O_3$ with a monoclinic structure (ICDD reference DOCE: 00-011-0370). An analysis of $\beta$-$Ga_2O_3$ spectra shows a strong dependency on the post-annealing temperature. As the post-annealing temperature increased, the crystallinity of the films improved, which result in enhanced peaks of XRD spectra. FIGS. 17A-17D provide transmission electron microscope (TEM) images of $Ga_2O_3$ grown on Si using a system of the invention. As expected, $Ga_2O_3$ deposited on Si at RT was an amorphous film without any crystalline patterns, as shown in FIG. 17A. In contrast, after post-annealing at 800° C., the film phase changed to a polycrystalline structure with a sharp interface between $\beta$-$Ga_2O_3$ and $SiO_2$, as illustrated in FIGS. 17B-17D.

Figures 18A, 18B:
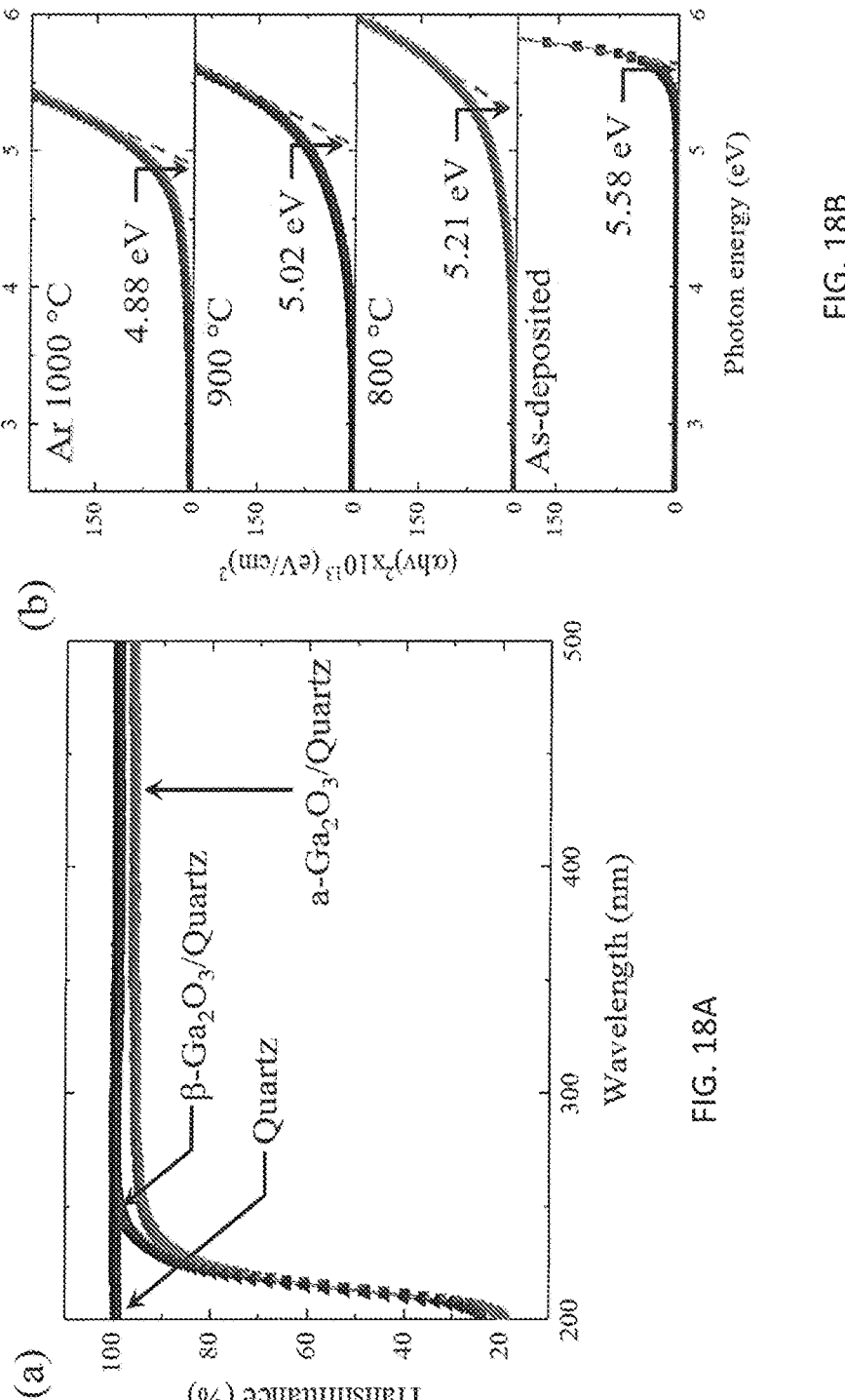
FIG. 18A Transmittance as a function of wavelength of $\beta$-$Ga_2O_3$ and a-$Ga_2O_3$ thin film on quartz.
FIG. 18B $(\alpha h\nu)^2$ dependence on $E_g$ of $Ga_2O_3$ deposited at RT with different post-annealing temperature from 800 to 1000° C.

FIG. 18A indicates the optical transmittance of the $Ga_2O_3$ thin film deposited on quartz at RT. $\beta$-$Ga_2O_3$ thin film exhibits almost 100% of optical transmittance in the wavelength except where the incident radiation is absorbed across the band gap ($E_g$). This value indicates the transparent nature of all the $Ga_2O_3$ thin film and is important for application such as dielectric coatings and antireflection coatings for solar cell. In contrast, a-$Ga_2O_3$ exhibited only 5% lower transparency than $\beta$-$Ga_2O_3$ thin film, indicating the potential of both $\beta$-$Ga_2O_3$ and a-$Ga_2O_3$ material for solar-blind photodetector. Since $Ga_2O_3$ is a material with direct bandgap, the absorption coefficient of $Ga_2O_3$ thin film can be expressed as a Tauc plot $$(\alpha h v)^2 = B(h v - E_g)$$

where $\alpha$ is the absorption coefficient, $B$ is a constant, and $h v$ is the energy of the incident photon. Optical bandgap extraction method from Tauc plot extrapolate the linear region of the incident photon energy ($h v$ as a function of $(\alpha h v)^2$ to the horizontal axis for the crystalline, while it is assumed to be $(\alpha h v)^{1/2}$ for amorphous material. The optical absorption coefficient, $\alpha$ is calculated using the relation $$\alpha = \frac{1}{t}\left[\ln\frac{T}{(1-R)^2}\right]$$

where R is the reflectance, T is the transmittance, and t is the film thickness. The optical bandgap extraction of $Ga_2O_3$ thin films such as as-deposited and various post-annealing temperature 800-1000° C. samples are illustrated in FIG. 4b. High absorption region of $(\alpha h v)^2$ as a function of $E_g$ indicates linear plots, resulting in direct allowed transition across $E_g$ $E_g$ of $Ga_2O_3$ thin film. The $E_g$ $E_g$ of the as-deposited a-$Ga_2O_3$ thin film grown by PEALD at RT recorded 5.58 eV and $E_g$ $E_g$ approached to ~4.9 eV, which is theoretical $E_g$ $E_g$ value of $\beta$-$Ga_2O_3$, as post-annealing temperature increased from 800 to 1000° C. The higher $E_g$ $E_g$ of as-deposited a-$Ga_2O_3$ thin film than 4.9 eV can be explained amorphous nature and minimized oxygen vacancy, which results in higher photoresponsivity under 222 nm than 254 nm. Thus, the suitability for solar-blind 222 nm DUV detection was proved for a-$Ga_2O_3$ thin film.

Figures 19A, 19B, 19C:
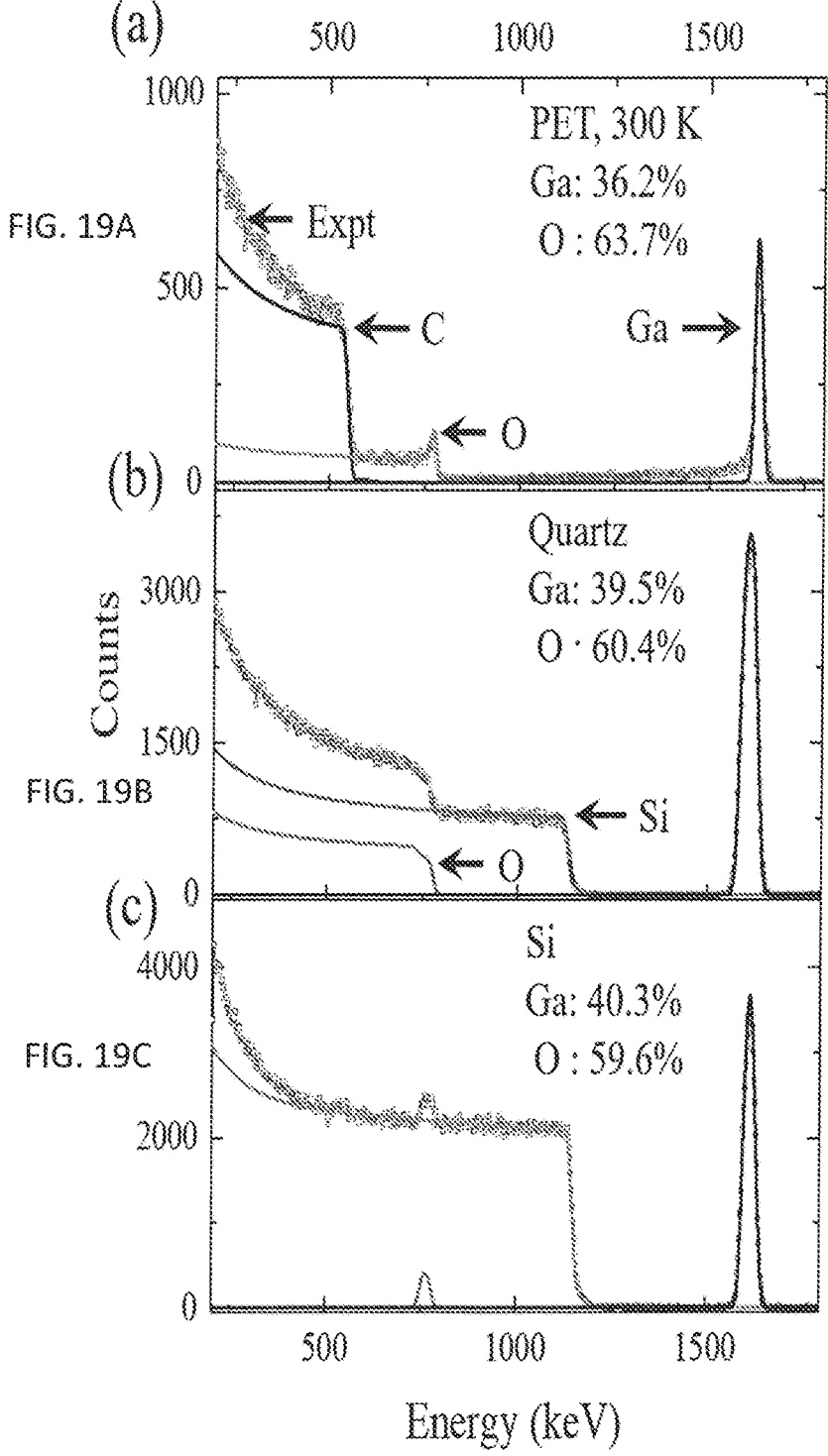
FIG. 19A shows RBS spectra of $Ga_2O_3$ deposited with RT on PET.
FIG. 19B shows RBS spectra of $Ga_2O_3$ deposited with RT on Quartz.
FIG. 19C shows RBS spectra of $Ga_2O_3$ deposited with RT on Si; the experimental and reference curve are indicated for each data set. Peaks caused by ion backscattering from Si, C, O and Ga atoms are shown.

The RBS spectra analysis for $Ga_2O_3$ thin film deposited in a system of FIG. 7 at RT on PET, quartz and Si substrate are illustrated in FIG. 19A-19C. The scattering of Ga element having the heaviest among the elements including both film and substrate presents at higher backscattered energy. The chemical concentration of the film can be verified by measured Ga width and height due to the calibration check for the composition of Rutherford scattering. In addition, the step edge and peaks due to ion backscattering from substrate C, Si, and O atoms are observed at each plot. The simulation curves calculated by the experimental parameters are in good agreement with the experimental RBS spectra, indicating chemical elements concentration of $Ga_2O_3$ film. Noted, since PEALD was performed at RT, $Ga_2O_3$ thin film can be deposited on PET substrate which glass transition temperature is ~67° C., as illustrated in FIG. 19A. Even though the ratio of O and Ga elements is ~1.75 that is slightly higher than reference value 1.5, this error is attributed by the decomposition of the polymer substrate. This is attributed to the fact that the high energetic ion scattering measurement from RBS can damage the substrate. Measurement of amorphous $Ga_2O_3$ film deposited on rigid substrates such as quartz and Si, as shown in FIGS. 19B and 19C indicates the atomic ratio of O and Ga is 1.52 and 1.47, respectively, demonstrating that negligible levels of impurities and oxygen vacancies exist in the films.

Figures 20A, 20B:
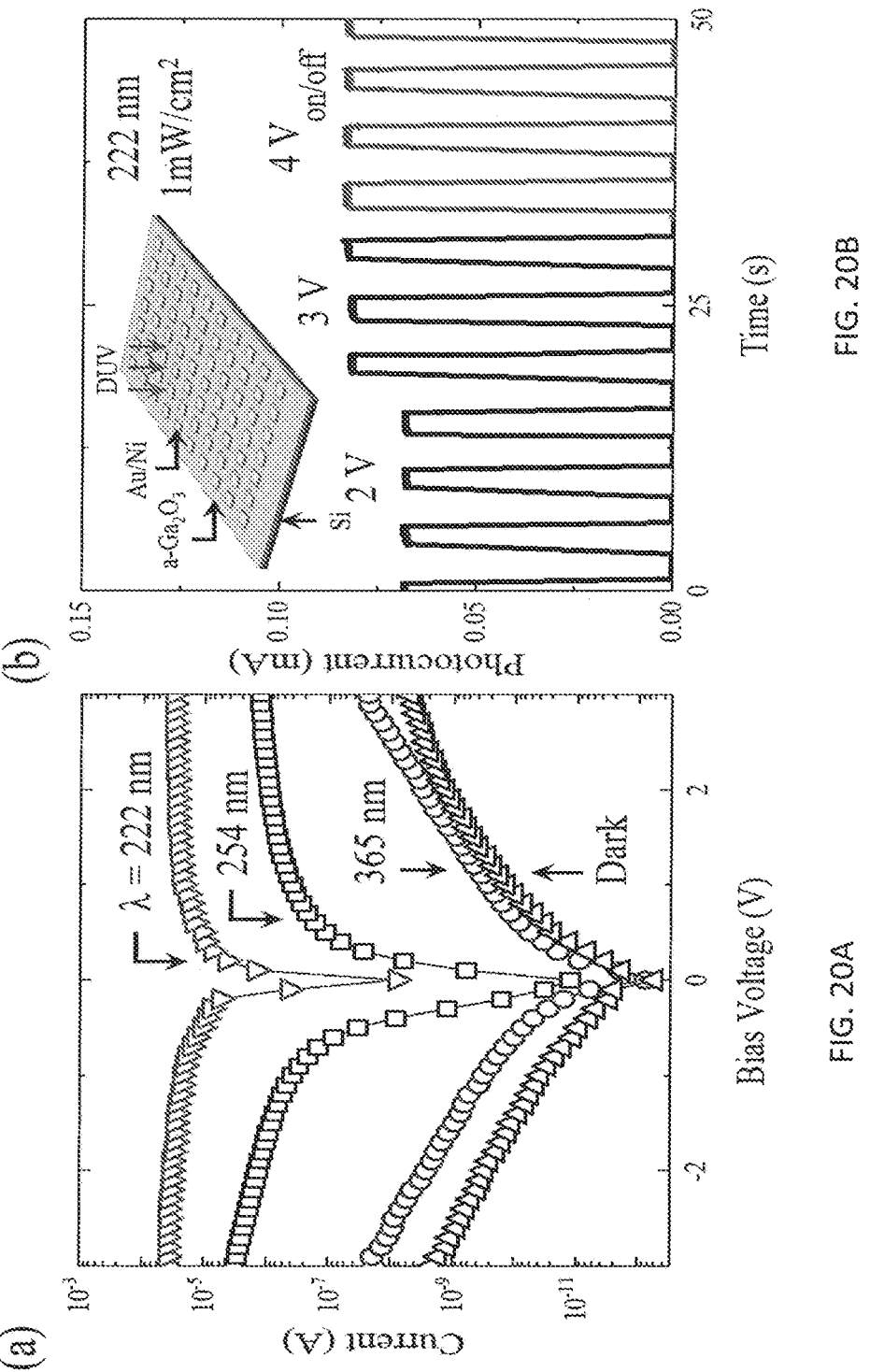
FIG. 20A shows I-V characteristics of an experimental metal/$Ga_2O_3$/metal (MSM) structure film based on DUV photodetector in the dark, under 365 nm, 254 nm and 222 nm light irradiation with logarithmic coordinate.
FIG. 20B shows the time dependent photoresponse of the MSM structure based a-$Ga_2O_3$ films under 222 nm UV illumination with 2.5 s on/off period.

In additional experiments, a flexible Deep Ultraviolet (DUV) photodetector was fabricated with amorphous $Ga_2O_3$ film deposited on PET substrate at RT using the FIG. 7 system. The use of inexpensive and easily processed substrate is essential for the extension of DUV sensor application. A rigid substrate requires a sophisticated technique for integrated circuit design and mass production of DUV photodetector due to its brittleness and hardness. However, the success of flexible DUV photodetector indicates that the entire processing scheme can be utilized in flexible optoelectronic devices thanks to the RT deposition of $Ga_2O_3$ film using the FIG. 7 system with an extremely thin layer. As a proof-of-concept experiment, a DUV photodetector with MSM structure was fabricated using the present system for a-$Ga_2O_3$ film deposition on Si and PET substrate and metal contact (Ni/Au) was deposited by E-beam evaporator. The current-voltage (I-V) characteristics of the DUV photodetector are demonstrated to verify the solar blind UV responsivity of MSM a-$Ga_2O_3$ films. The photoresponse of a semiconductor to photon consists of electron-hole pairs generation, trapping, and recombination procedure. There are two methods to generate electron-hole pairs under the UV excitation: 1) carrier generation from the valence-conduction band, and 2) carrier recombination from defect-conduction band transitions. For the semiconductor photo-excitation, majority of photogenerated carriers are generated from the valance-conduction band due to UV excitation and only a few carriers are created from defect-conduction band transition. Thus, the photocurrent under 22 nm and 254 nm UV radiation are much larger than UV light with 365 nm as shown in FIG. 20A. It can be observed that the dark current of photodetector was obviously smaller than that with 222 nm, 254 nm, and 365 nm radiation. According to the measured result, the dark current was around of $1 \times 10^8$ A which is low enough for photodetector applications. The results indicated that oxygen vacancies in the $Ga_2O_3$ film were minimized even at RT deposition using the present system, providing a few free electrons from gallium atoms. In addition, the highly resistive nature of $Ga_2O_3$ film causes small dark current. Based on bandgap calculation of direct bandgap material, the bandgap of a-$Ga_2O_3$ is 5.58 eV, expecting higher photoresponse at 222 nm than 254 nm. As expected, the photoresponse of a-$Ga_2O_3$ deposited on Si exhibits higher photoresponse at 222 nm than 254 nm lamp illumination. FIG. 20B indicates photoresponse of photodetector under 222 nm DUV illumination 2.5 s periodically on and off with different bias voltage. The photocurrent increased with increasing bias voltage and it eventually saturated at 4 V. Inset is the schematic of the MSM structure of 90 nm thickness of a-$Ga_2O_3$/Si based photodetector.

Figures 21A, 21B, 21C:
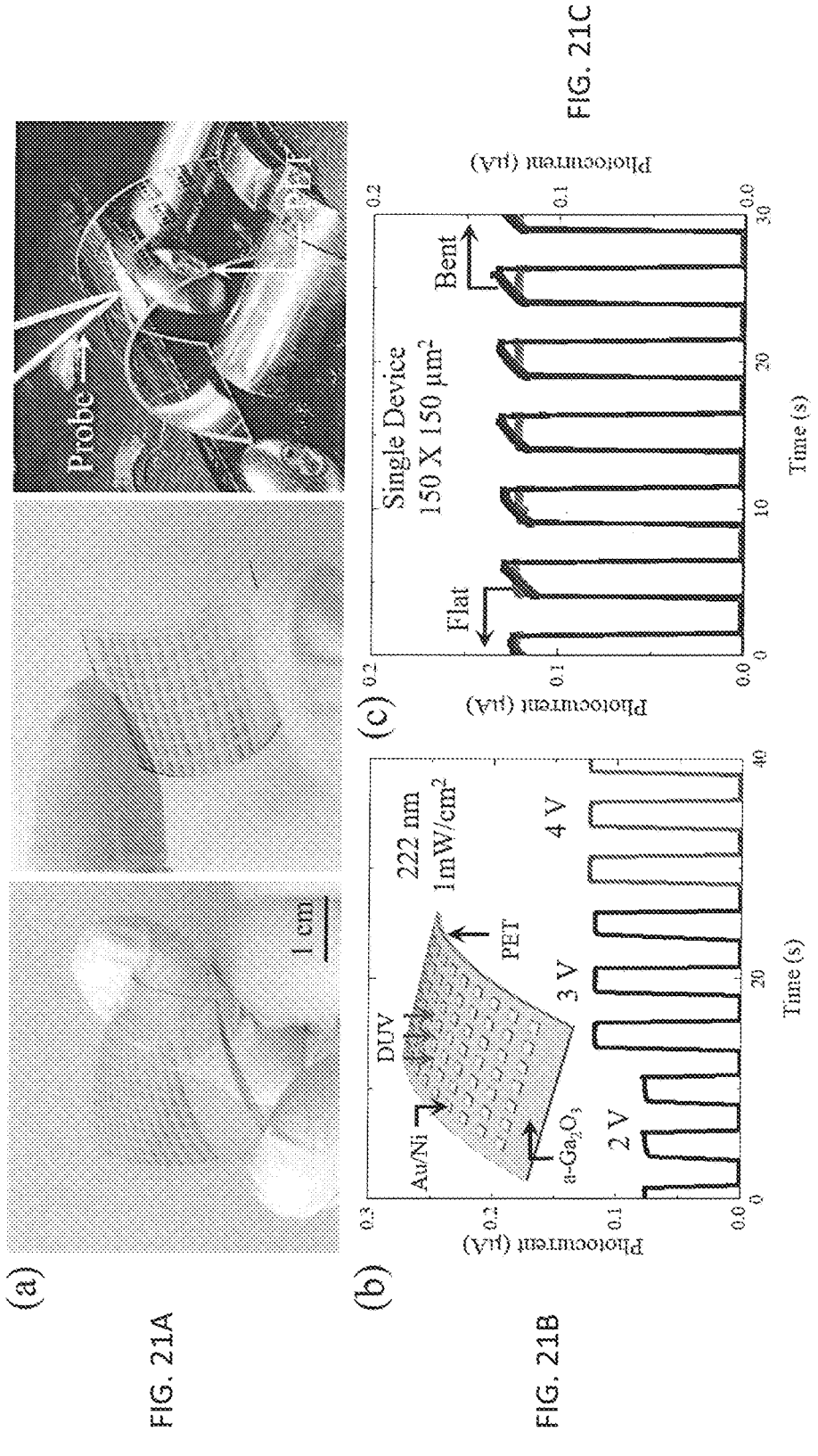
FIG. 21A is a photograph of an experimental flexible DUV photodetector with convex/concave curvature and electrical characteristic measurement at the probestation with DUV photodetector.
FIG. 21B shows time dependent photoresponse of a-$Ga_2O_3$ based MSM structure under 222 nm UV illumination with 2.5 s on/off period.
FIG. 21C shows measurement data of photodetector performance under 222 nm illumination before and after bending the photodetector with a bending radius of 5 mm.

FIG. 21A exhibits the fabricated flexible DUV photodetector images with convex and concave curvature and electrical property measurement of flexible DUV detector on the probe station. Similar with rigid photodetector above, the photoresponse of a-$Ga_2O_3$ deposited on PET exhibits higher photoresponse at 222 nm lamp illumination and photocurrent was gradually saturated when bias voltage increased to 4 voltage, as illustrated in FIG. 21B. Inset is the MSM structure of 40 nm thickness of flexible a-$Ga_2O_3$/PET based photodetector. To examine the performance of the flexible a-$Ga_2O_3$ based photodetector under a beading strain, on/off repetitive measurements were performed. In FIG. 7C, plot indicates the detection performance under 222 nm illumination of the flat and bent status of the photodetector, respectively. The device exhibits an identical response after multiple illumination cycles. Even though photocurrent of bent photodetector was slightly changed compared to flat one, the operation of photodetector was stable after several banding-flat steps. The changed plot of bent photodetector can be explained by the delamination of Au/Ni metal contact. The device has no obvious degradation after manually 100 times folding cycles which may be relevant with the durability of the amorphous structure against bending and stretching stress.

Meanwhile, a wide band gap semiconductor has extremely deep trap which is responsible for the time constant of the transient decay. Some of the photogenerated carriers are captured due to trapping state in β-$Ga_2O_3$ which result in slow-response from UV light on. This is due to the fact that the presence of oxygen vacancies defects β-$Ga_2O_3$ films which are commonly known as low response detection a few milliseconds to seconds. It limits their practical application for high-speed sensing and imaging application. Otherwise, for the a-$Ga_2O_3$ film, electron produced by conduction band is recombined with hole through recombination center when illumination is turned off. This process is fast, providing a fast response of current decay. Typically, rise time can be defined as the time interval for photocurrent to increase 10-90%. To estimate the response speed of the a-$Ga_2O_3$ photodetectors, the rise and fall time were measured under DUV illumination. Relative photocurrent intensity as a function of time for 90 nm thickness of a-$Ga_2O_3$/Si photodetector under 40 kHz periodic on/off illumination was taken. The rise time and fall time were measured 3.8 μs and 4.2 μs, respectively. Due to the distinct illumination characteristic of the lamp source, secondary photoresponse was also observed after fundamental photoresponse. A time-dependent relative photoresponse of 40 nm thickness of bent a-$Ga_2O_3$/PET photodetector was observed. The rise time and fall time of detector were 6.5 μs and 12.7 μs under the 40 kHz on/off illumination respectively and 6.7 μs and 18.6 μs were recorded by 27 kHz on/off illumination. As discussed above, oxygen vacancies cause increasing the transit and the rise time constants due to the formation of trap states in the band gap. Therefore, negligible oxygen vacancies in the RT grown a-$Ga_2O_3$ thin film improves carrier transport properties, resulting in the fast photoresponse and high responsivity. Responsivity and response times of a-$Ga_2O_3$ deposited via present methods generally surpasses others due to less material defects. The responsivity difference between a-$Ga_2O_3$/Si and a-$Ga_2O_3$/PET is ascribed to both metal contact and leakage current. Since PET substrate is not suitable for thermal annealing for good metal contact, annealing at 300 C with $N_2$ environment was only performed with Si based photodetector. It leads to higher photocurrent with increasing dark current at the same time. In addition, Si substrate shows relatively higher conductivity than PET substrate which causes that Si based photodetector exhibits relatively higher leakage current than PET. Considering aforementioned results, a-$Ga_2O_3$ thin film was successfully deposited by the present methods at RT on Si, quartz and even polymer substrate such as PET with less material defect, resulting high responsivity and fast response time with rapid recovery DUV photodetector In particular, the characteristics of a-$Ga_2O_3$ photodetector include high photoexcited current (a-$Ga_2O_3$/Si: 0.08 mA), high responsivity and high speed response time (a-$Ga_2O_3$/Si: $t_{rise}$=3.8 μs, $t_{fall}$=4.2 μs, a-$Ga_2O_3$/PET: $t_{rise}$=6.5 μs, $t_{fall}$=12.7 μs). In addition, flexible photodetectors exhibit stable performance and significant degradation was not observed during bending and fatigue tests. The results signify that the applicability of synthesized amorphous $Ga_2O_3$ by PEALD at RT can find a lot of potential applications such as high-speed secure communication, space detection and missile alarming and tracking While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. An atomic layer deposition reactor system, comprising:
a reactor chamber;
an array of microcavity or microchannel plasma devices located within the reactor chamber, the array of microcavity or microchannel plasma devices including a first electrode and a second electrode electrically and physically isolated from a plasma region located in the microcavities or microchannels;
an inlet extending from outside the reactor chamber to the plasma region of the array of microcavity or microchannel plasma devices;
a non-plasma medium deposition precursor source connected to the inlet;
a plasma medium deposition precursor source connected to the inlet;
a substrate holder within the reactor chamber;
an outlet from the plasma region of the array of microcavity or microchannel plasma devices positioned to disperse plasma products over the surface of a substrate on the substrate holder;
control valves located outside the deposition chamber;
a controller configured to control the control valves to provide ratios, pressures, flow rates, and timing sequences for the non-plasma medium deposition precursor source and the plasma medium deposition precursor source to perform atomic layer deposition using both of the precursors; and
an exhaust from the reactor chamber.

2. The deposition reactor system of claim 1, wherein the non-plasma medium deposition precursor source and the plasma medium deposition precursor source comprise a plurality of gas sources and/or bubblers.

3. The deposition reactor of claim 2, wherein the array of microcavity or microchannel plasma devices comprise an array of microcavities, wherein the array of microcavities is formed in a thin oxide sheet with a buried metal electrode as the first electrode, the reactor comprising a cover to cover the microcavities and a top electrode as the second electrode upon the cover.

4. The deposition reactor of claim 2, wherein the array of microcavity or microchannel plasma devices comprise opposing arrays of microcavities, wherein the arrays of microcavities are formed in a thin oxide sheet with a buried metal electrode as the first electrode, wherein the inlet from outside of the reactor chamber to the plasma region of the array of microcavity or microchannel plasma devices directs precursor between the opposing arrays of microcavities.

5. The deposition reactor of claim 2, wherein the array of microcavity or microchannel plasma devices comprise an array of microchannels, wherein the array of microchannels is formed in a thin oxide sheet with a buried metal electrode as the first electrode, the reactor comprising a cover to cover the microchannel and a top electrode as the second electrode upon the cover.

6. The deposition reactor of claim 5, wherein the array of microchannels is parallel to a direction of precursor flow from the inlet from outside of the reactor chamber to the plasma region of the array of microcavity or microchannel plasma devices to the outlet from the plasma region of the array of microcavity or microchannel plasma devices.

7. The deposition reactor of claim 5, wherein the array of microchannels is orthogonal to a direction of precursor flow from the inlet from outside of the reactor chamber to the plasma region of the array of microcavity or microchannel plasma devices to the outlet from the plasma region of the array of microcavity or microchannel plasma devices.

8. The deposition reactor of claim 2, wherein the array of microcavity or microcavity plasma devices comprise opposing arrays of microchannels, wherein the arrays of microchannels are formed in a thin oxide sheet with a buried metal electrode as the first electrode, wherein the inlet from outside of the reactor chamber to the plasma region of the array of microcavity or microchannel plasma devices directs precursor between the opposing arrays of microchannels.

9. The deposition reactor of claim 2, wherein the array of microcavity or microcavity plasma devices comprise an array of microcapillary microchannels formed azimuthally around a core.

10. The deposition reactor of claim 9, wherein the core is a solid core.

11. The deposition reactor of claim 10, wherein the core comprises optical material that transmits optical fluorescence.

12. The deposition reactor of claim 9, wherein the core is a hollow tube configured to transport the non-plasma medium deposition precursor source and the plasma medium deposition precursor source.

* * * * *